United States Patent [19]
Jarrett et al.

[11] Patent Number: 5,865,518
[45] Date of Patent: *Feb. 2, 1999

[54] FLEXIBLE COMPUTER CHASSIS ADAPTED TO RECEIVE A PLURALITY OF DIFFERENT COMPUTER COMPONENTS OF DIFFERENT SIZES AND CONFIGURATIONS

[75] Inventors: Brian S. Jarrett, Cornelius; Robert A. Eldridge, Beaverton, both of Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 870,859

[22] Filed: Jun. 6, 1997

Related U.S. Application Data

[63] Continuation of Ser. No. 536,838, Sep. 29, 1995, abandoned.

[51] Int. Cl.⁶ .......................... A47B 77/08; A47B 81/00
[52] U.S. Cl. ...................................... 312/223.2; 361/683
[58] Field of Search ........................... 312/223.1, 223.2; 220/4.02; 361/679, 683–685

[56] References Cited

U.S. PATENT DOCUMENTS

| | | | |
|---|---|---|---|
| 5,022,863 | 6/1991 | Keens et al. | 439/108 |
| 5,032,951 | 7/1991 | Schropp et al. | 312/223.2 X |
| 5,235,493 | 8/1993 | Yu | 312/223.2 X |
| 5,269,598 | 12/1993 | Liu | 312/223.2 |
| 5,430,608 | 7/1995 | Honda et al. | 361/683 |
| 5,438,476 | 8/1995 | Steffes | 312/223.2 X |
| 5,447,367 | 9/1995 | Wei | 312/223.2 X |
| 5,460,441 | 10/1995 | Hastings et al. | 312/223.2 X |
| 5,466,059 | 11/1995 | Liu | 312/223.2 |
| 5,513,068 | 4/1996 | Girard | 361/683 X |
| 5,519,573 | 5/1996 | Cobb et al. | 361/683 X |
| 5,523,917 | 6/1996 | Searby | 312/223.2 X |
| 5,527,104 | 6/1996 | Moss | 312/223.2 X |
| 5,555,158 | 9/1996 | Dent | 361/684 |
| 5,587,877 | 12/1996 | Ryan et al. | 312/223.2 X |

*Primary Examiner*—James R. Brittain
*Assistant Examiner*—Robert J. Sandy
*Attorney, Agent, or Firm*—Blakely, Sokoloff, Taylor & Zafman LLP

[57] ABSTRACT

A flexible chassis for a computer system that is adapted to receive computer components of different sizes and configurations. The flexible chassis includes a printed circuit board (PCB) mounting plate that is adapted to receive baseboards of different sizes, a back panel that is adapted to receive different Input/Output (I/O) covers that accommodate the different placement of I/O plugs on different baseboards, a vertical bulkhead having a plurality of different mounting locations for a CPU fan and an I/O fan, and a relocatable PCB support rod assembly adapted to support memory and I/O cards which are coupled to different locations on the various baseboards.

13 Claims, 43 Drawing Sheets

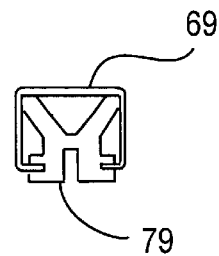
FIG.10A
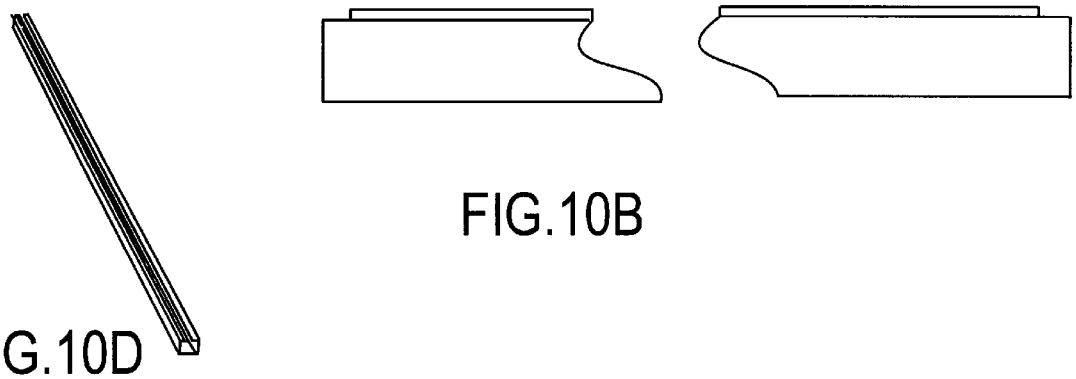
FIG.10D
FIG.10B
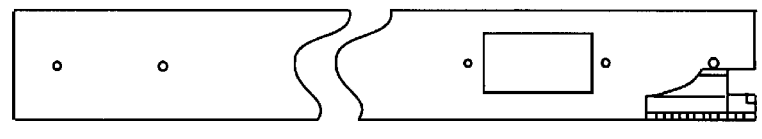
FIG.10C

FIG.12C
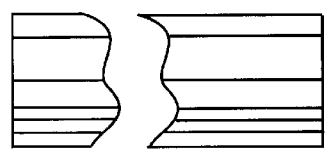
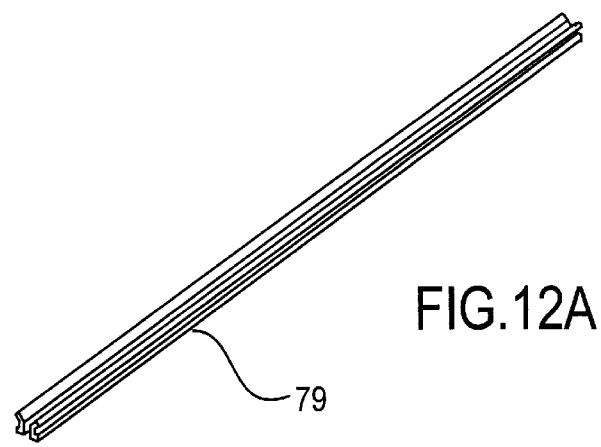
FIG.12A
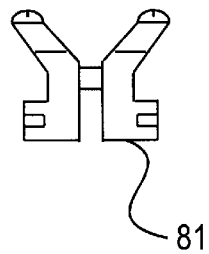
FIG.12B ( REAR I/O PANEL 19 )    ( VERTICAL BULKHEAD 17 )
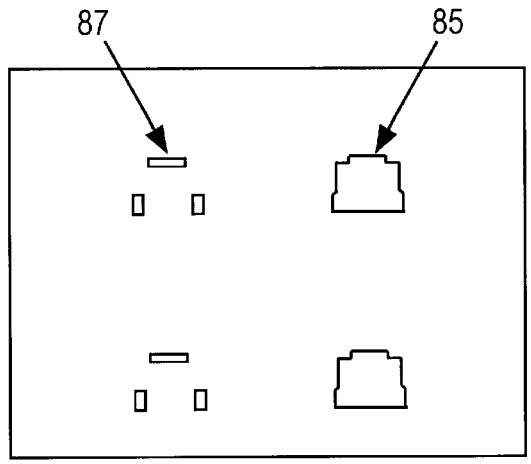
FIG.13
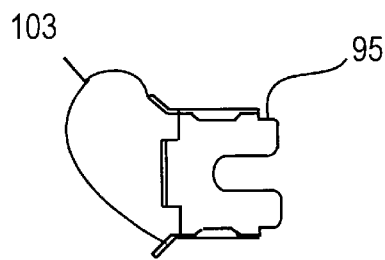
FIG.14A
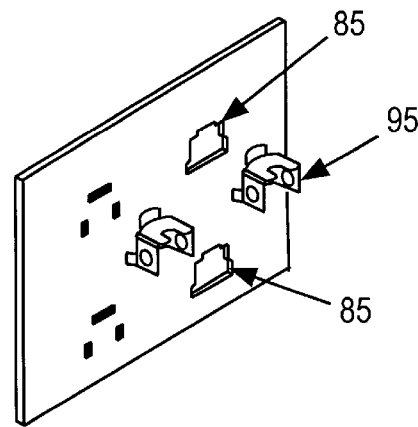
FIG.15
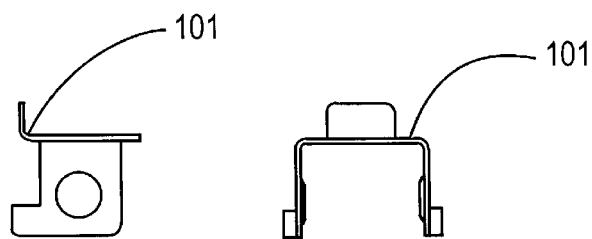
FIG.14B        FIG.14C

FLEXIBLE COMPUTER CHASSIS ADAPTED TO RECEIVE A PLURALITY OF DIFFERENT COMPUTER COMPONENTS OF DIFFERENT SIZES AND CONFIGURATIONS This is a continuation of application Ser. No. 08/536,838 filed Sep. 29, 1995, now abandoned.

BACKGROUND OF THE INVENTION

1. Field of the Invention

The present invention relates to computer chassis that house computer components. More particularly, the present invention relates to a flexible computer chassis that is adapted to receive a number of different types of computer components, which have different configurations and sizes (e.g., baseboards of different sizes, peripheral and processor fans having various configurations, and different power supplies).

2. Art Background

An essential component of any computer system is the computer chassis that houses all the other computer components. As technology advances, computer users desire greater speed and computing power for the ever advancing software applications that demand greater memory, and processing speed. In the past, the new memory requirements and processing power, required by these new applications, could be satisfied by either upgrading the baseboard (also known in the industry as a "motherboard") with additional memory cards or by swapping processors.

However, as software applications demand further processing power and memory (e.g., real time processing, multimedia application, and teleconferencing), many users have found it more practical to completely replace their baseboard with a new baseboard, which is integrated with a new and more powerful processor, and additional memory and Input/Output (I/O) subsystems. As the cost of new baseboards (e.g., pre-configured central processing unit (CPU) with memory and I/O subsystems) has decreased, the feasibility and desirability of simply replacing an old baseboard with a new baseboard have increased.

Prior art computer chassis suffer numerous disadvantages. First, prior art chassis are designed and manufactured to house only one baseboard having a predetermined size and one predetermined configuration of computer components associated with that baseboard (e.g., fixed mounting locations for I/O and CPU fans, fixed support mechanism for add-in I/O or memory cards, and fixed locations in the I/O panel for allowing connection of the baseboard with other computer devices). When a computer user wishes to replace an old baseboard with a new baseboard, he is required to purchase a new chassis that can house the new baseboard and associated components. This need to replace the computer chassis greatly increases the cost to the user. This excess cost is multiplied by the number of times a computer user upgrades from one baseboard having a predetermined size to another baseboard having a different size (i.e., a baseboard having larger dimensions).

Another disadvantage of prior art computer chassis from a computer manufacturer's point of view is that a manufacturer must re-machine a new chassis whenever the configuration or size of the components of a computer system changes. For example, when a new baseboard has increased dimensions (e.g. length and width), a computer manufacturer incurs substantial costs to re-tool and to re-machine an existing chassis so that it can adapt and house the new baseboard with its associated computer components. This additional cost to the manufacturer is passed down to the computer users, further increasing the cost of the computer system.

It can be seen from the foregoing that it would be desirable to provide a flexible computer chassis that can be adapted to receive computer components of varying sizes and configurations.

SUMMARY OF THE INVENTION

From the foregoing, it can be seen that it would be desirable to provide a flexible computer chassis that is adapted to receive computer components of varying sizes and configurations. It would also be desirable that this flexible chassis be easily adapted to house these computer components of different sizes so that a computer user can upgrade his computer system without having to buy a new computer chassis. Accordingly, the present invention provides an easy to use, relatively inexpensive flexible computer chassis that is adapted to house computer components of different sizes and configurations.

The invented flexible chassis includes four key components. First, the flexible chassis provides a printed circuit board (PCB) mounting plate that is adapted to receive baseboards of different sizes. A baseboard is mounted to the PCB mounting plate. The combination of the baseboard and the mounting plate is then coupled to a side wall of a chassis wrap. When a user wishes to upgrade to a baseboard having a different size and configuration from a current baseboard, only the PCB mounting plate need be modified (i.e., new mounting locations on the PCB mounting plate will adapt the baseboard to the flexible chassis).

Second, the flexible chassis provides a rear I/O panel that is adapted to receive different patch panels. Since the I/O connectors of different baseboards vary in location, a user simply couples an appropriate patch panel to the rear I/O panel to adapt a new baseboard to the flexible chassis. In prior art systems, a new rear I/O panel would need to be re-tooled and re-machined so that the rear I/O panel would support the new baseboard.

Third, the present invention provides a vertical bulkhead that has a plurality of mounting locations for different fans assemblies (e.g. CPU and I/O memory fans). As a baseboard changes, often the location of the memory, the CPU, and the I/O bus slots are correspondingly changed. These multiple mounting locations in the vertical bulkhead enable a user to positions the fans in their respective positions to maximize the cooling effect on those computer components that generate the most heat.

Last, this flexible chassis provides a relocatable printed circuit board (PCB) support rod assembly that may be adjusted and adapted to support different memory and processor cards that are plugged into the baseboard. Since different baseboards often have different bus locations and slots, and these cards that are plugged into the baseboard often require mechanical support, the relocatable support rod assembly provides a flexible way to provide the support to these processor and memory cards.

BRIEF DESCRIPTION OF THE DRAWINGS

FIG. 10 illustrates a perspective and a cross-sectional view of the module rail used in the present invention.

FIG. 12A illustrates a perspective view of the card-receiving portion of the module rail of the present invention. FIG. 12B illustrates a cross sectional view of the card-receiving portion of the module rail shown in FIG. 12A. FIG. 12C illustrates another view of the card-receiving portion of the module rail shown in FIG. 12A.

FIG. 13 illustrates a pattern that receives a module rail clip of the present invention.

FIG. 14A illustrates a bottom elevational view of the module rail clip of the present invention. FIG. 14B illustrates a side elevational view of the module rail clip of the present invention. FIG. 14C illustrates a rear elevational view of the module rail clip of the present invention.

FIG. 15 illustrates a perspective view of how the module rail clip is coupled to the vertical bulkhead of the present invention.

DETAILED DESCRIPTION

The present invention will be described with reference to the drawings which illustrate particular embodiments of the invention. Specific details pertinent to the invention will be described for a thorough understanding of the invention. However, in order not to unnecessarily obscure the invention, certain items will be described in general terms as they are well understood by those of ordinary skill in the art, particularly in the art of computer chassis design and manufacture. Thus, a discussion of a well known means for coupling the various mechanical structures of the chassis of the present invention will be omitted or described only generally. For example, when two mechanical structures are coupled together, the detailed description will not specify what means are used to couple these mechanical pieces together, since any suitable means for coupling can be used and are well known to those skilled in the art.

Figure 1C:
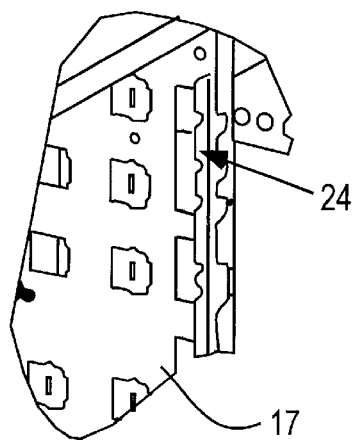
FIG. 1C illustrates a partial enlarged perspective view of FIG. 1A along view B-B'.
Figure 1B:
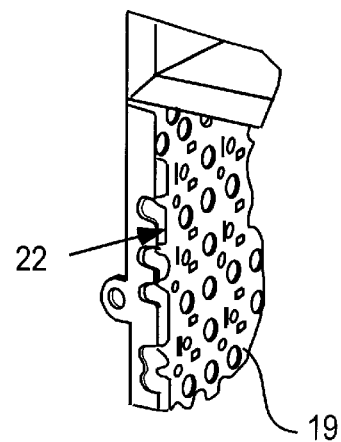
FIG. 1B illustrates a partial enlarged perspective view of FIG. 1A along line A-A'.
Figure 1A:
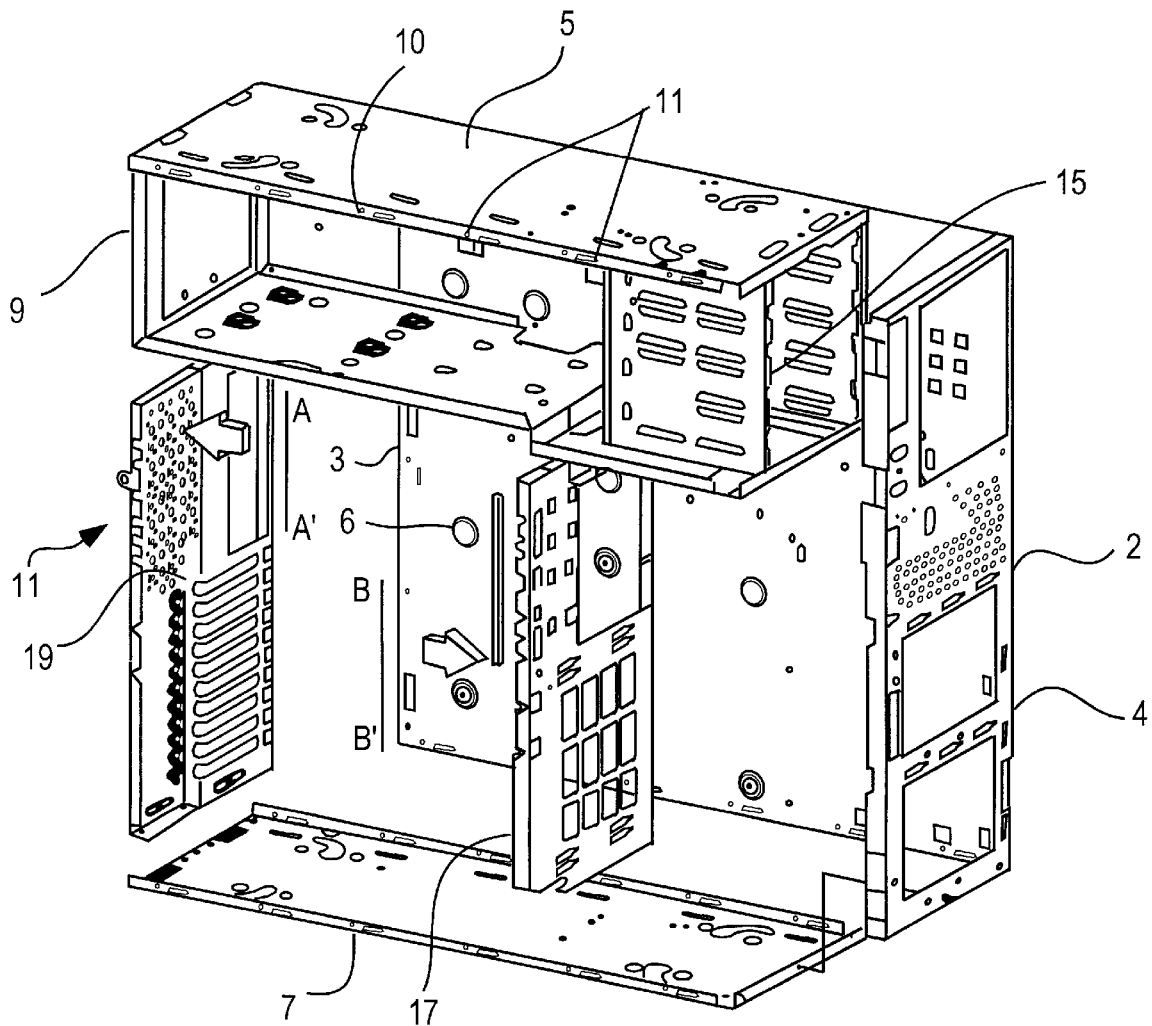
FIG. 1A illustrates an exploded perspective view of the computer chassis of the present invention.

FIG. 1A illustrates an exploded perspective view of the chassis of the present invention. The chassis 1 includes a chassis wrap 2 which includes a side area 3 for receiving a baseboard mounting plate (not shown) and a front area 4 for receiving a top and bottom plastics assemblies (not shown). The chassis wrap 2 includes a plurality of engagement embosses 6 disposed in the baseboard mounting plate receiving area 3. These engagement embosses 6 are adapted to receive the baseboard mounting plates. The chassis 1 further includes a top panel 5 and a bottom panel 7, both of which are coupled to the chassis wrap 2. The top and bottom panels (5,7) are of similar construction and are well known to those skilled in the art.

The chassis 1 further includes a horizontal bulkhead 9 that is coupled to the chassis wrap 2 and also to the top panel 5 through a drive bay 15. The horizontal bulkhead 9 includes a plurality of power supply bracket engagement embosses 10 that are adapted to receive a power supply bracket (not shown). FIG. 1A also illustrates a plurality of power supply bracket mounting hooks 11. In this embodiment, two hooks 11 are disposed on the chassis wrap 2, and four hooks 11 are disposed on the horizontal bulkhead 9. The drive bay 15 can support a plurality of disk drives (not shown).

The chassis 1 further includes a vertical bulkhead 17 and a rear input/output (I/O) panel 19, both of which are coupled to the bottom panel 7 and the horizontal bulkhead 9.

FIG. 1B illustrates an enlarged partial perspective view of the chassis of FIG. 1A through line A–A'.

FIG. 1B illustrates an extended card mounting bracket 22 that is coupled directly to the rear I/O panel 19. This extended bracket supports a module rail that is adapted to provide mechanical support to a card having an approximate height of 7 inches (e.g. a 7.2 inch card).

FIG. 1C illustrates an enlarged perspective view of the chassis of FIG. 1A through line B–B'.

FIG. 1C illustrates an extended card mounting bracket 24 for supporting a module rail adapted to provide mechanical support for cards having a height of about 7 inches (e.g. a 7.2 inch card). This extended bracket 24 is coupled directly to the vertical bulkhead 17.

Figure 2:
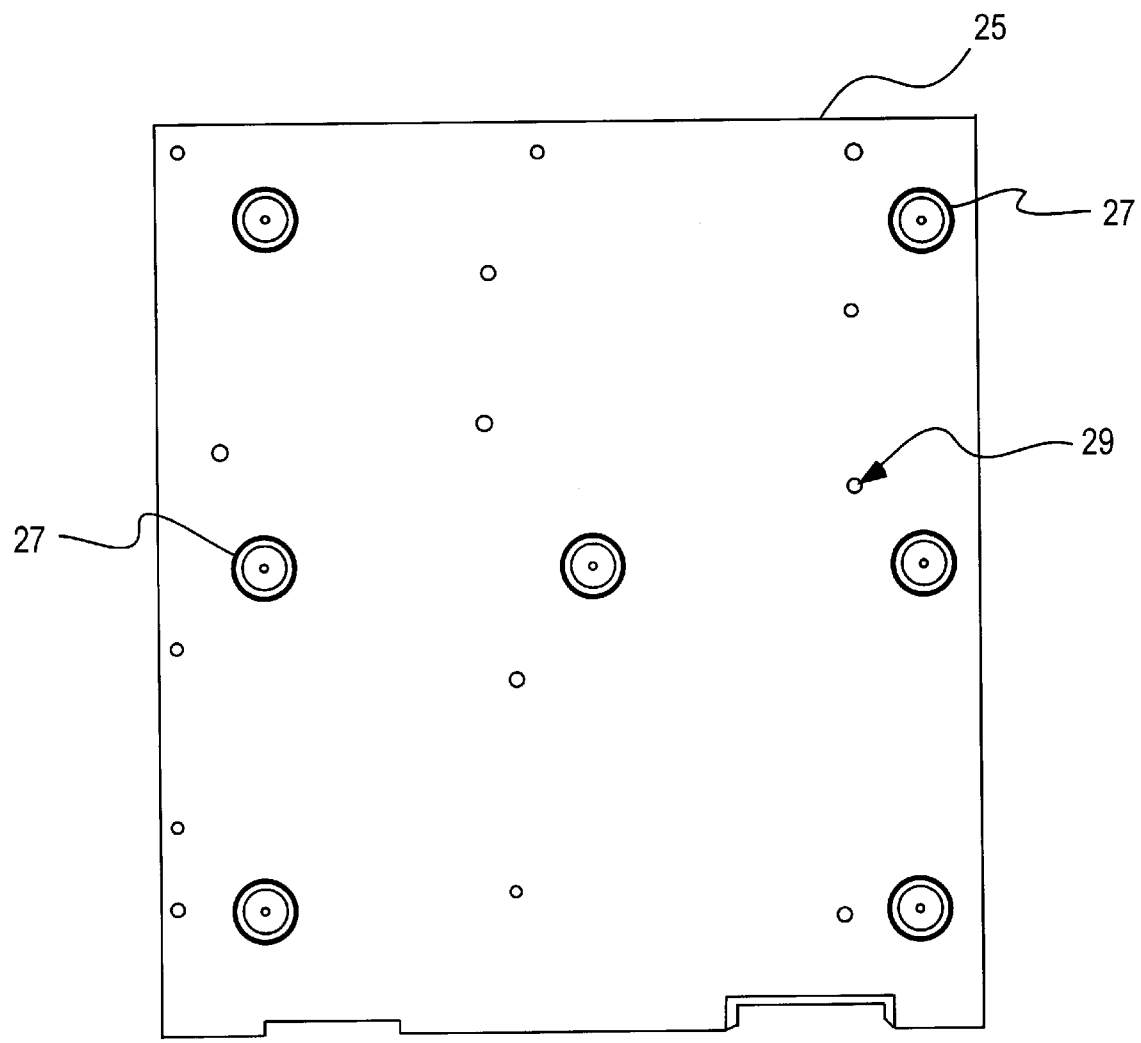
FIG. 2 illustrates a front elevational view of a baseboard mounting plate that may be used in one embodiment of the present invention.

FIG. 2 illustrates a baseboard mounting plate 25 that is used in one embodiment of the present invention. The baseboard mounting plate 25 includes a plurality of recesses 27 that are formed to engage the engagement embosses 6, illustrated in FIG. 1A. Baseboard mounting plate 25 also includes a plurality of baseboard mounting locations 29. The baseboard (not shown) is mounted to the baseboard mounting plate 25 through the use of the baseboard mounting locations 29. The combination of the baseboard and the mounting plate 25 is removably coupled to the side area 3 of the chassis wrap 2.

Figure 3:
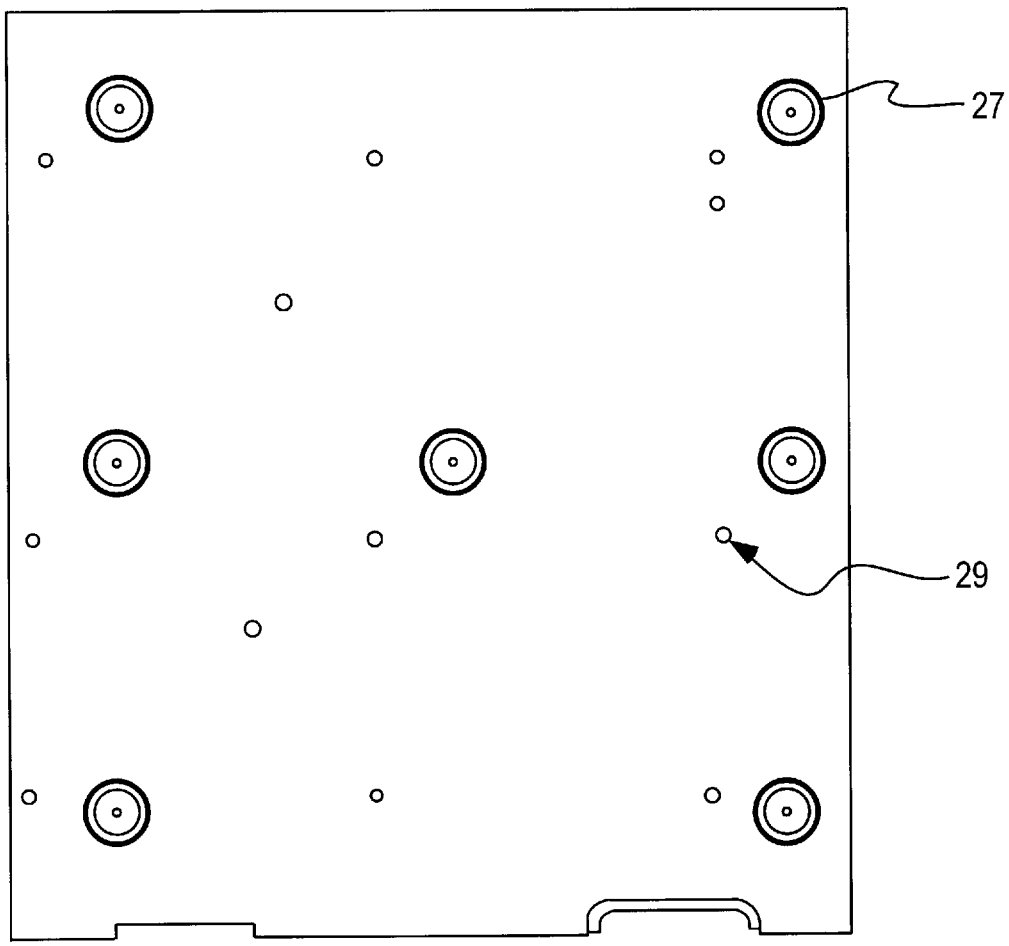
FIG. 3 illustrates a front elevational view of an alternative baseboard mounting plate that may be used in an alternative embodiment of the present invention.

FIG. 3 illustrates a different baseboard mounting plate for use in an alternative embodiment of the present invention. The baseboard mounting plate of FIG. 3 also includes the recesses 27 and the baseboard mounting locations 29. It should be noted that the recesses 27 are in similar positions along the baseboard mounting plate (i.e., the recesses are similarly situated in both FIG. 2 and FIG. 3 to couple to the engagement embosses 6 on the chassis wrap 2. However, the baseboard mounting locations 29 are situated differently in FIGS. 2 and 3 to adapt to the size and shape (i.e., to conform to the placement of the corresponding mounting locations disposed on the respective baseboard) of the particular baseboard being used.

Figure 4:
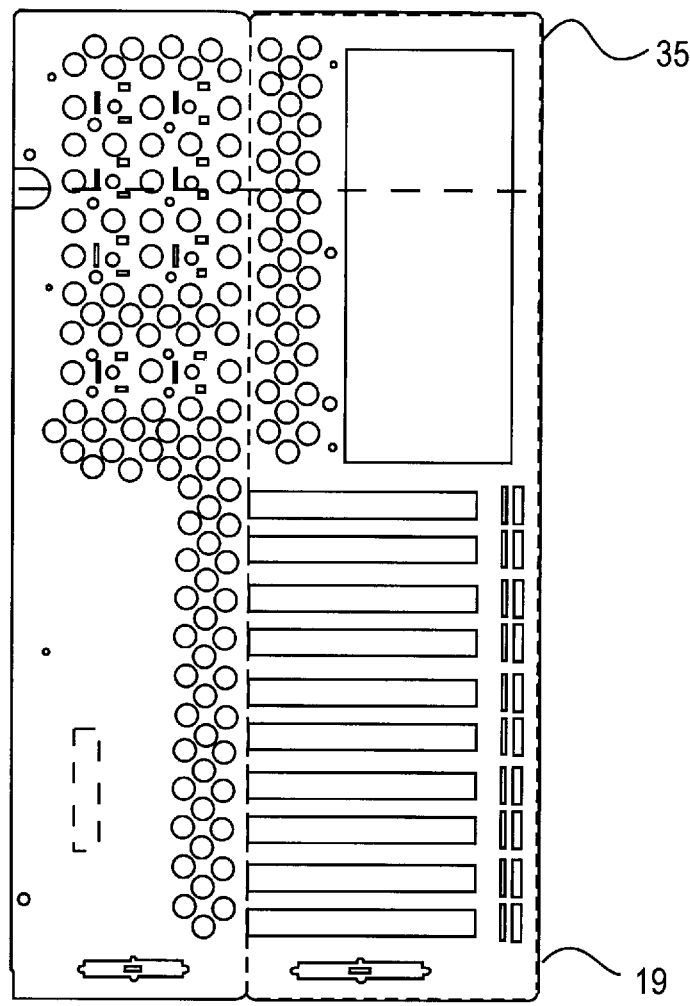
FIG. 4 illustrates a front elevational view of the rear input/output (I/O) panel of the present invention.

FIG. 4 illustrates the rear I/O panel 19. This rear I/O panel 19 includes an area for receiving a number of different input/output (I/O) patch panels (described in FIGS. 5 and 6 hereinafter).

Figure 5:
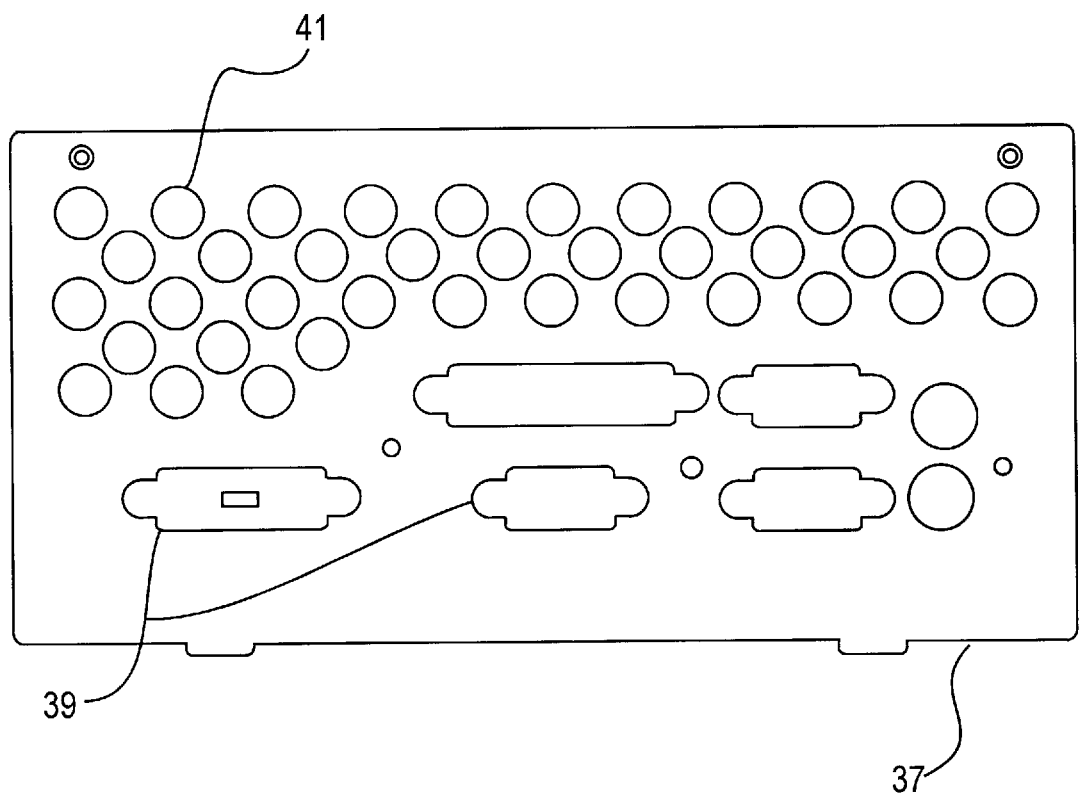
FIG. 5 illustrates a front elevational view of an input/output (I/O) patch panel that may be used in one embodiment of the present invention.

FIG. 5 illustrates a patch panel 37 that is removably coupled to the rear I/O panel 19. This patch panel 37 defines a plurality of openings 39 for housing connectors of various shapes and sizes. The patch panel 37 also includes a plurality of circular perforations 41 for allowing air flow out of the chassis.

Figure 6:
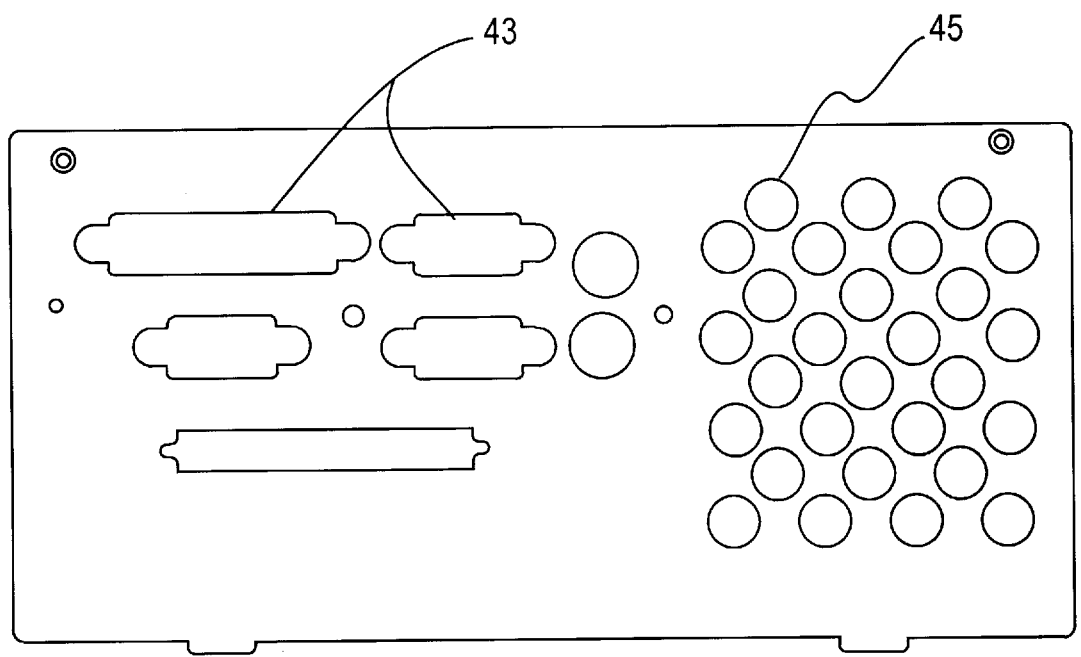
FIG. 6 illustrates a front elevational view of a different I/O patch panel that may be used in an alternative embodiment of the present invention.

FIG. 6 illustrates an alternative patch panel 38 for use in an alternative embodiment of the present invention. As can be readily seen in FIG. 6, the location of the openings 43 for housing different connectors and the perforations 45 are different in this patch panel 38 when compared to the patch panel 37, illustrated in FIG. 5.

Figure 7:
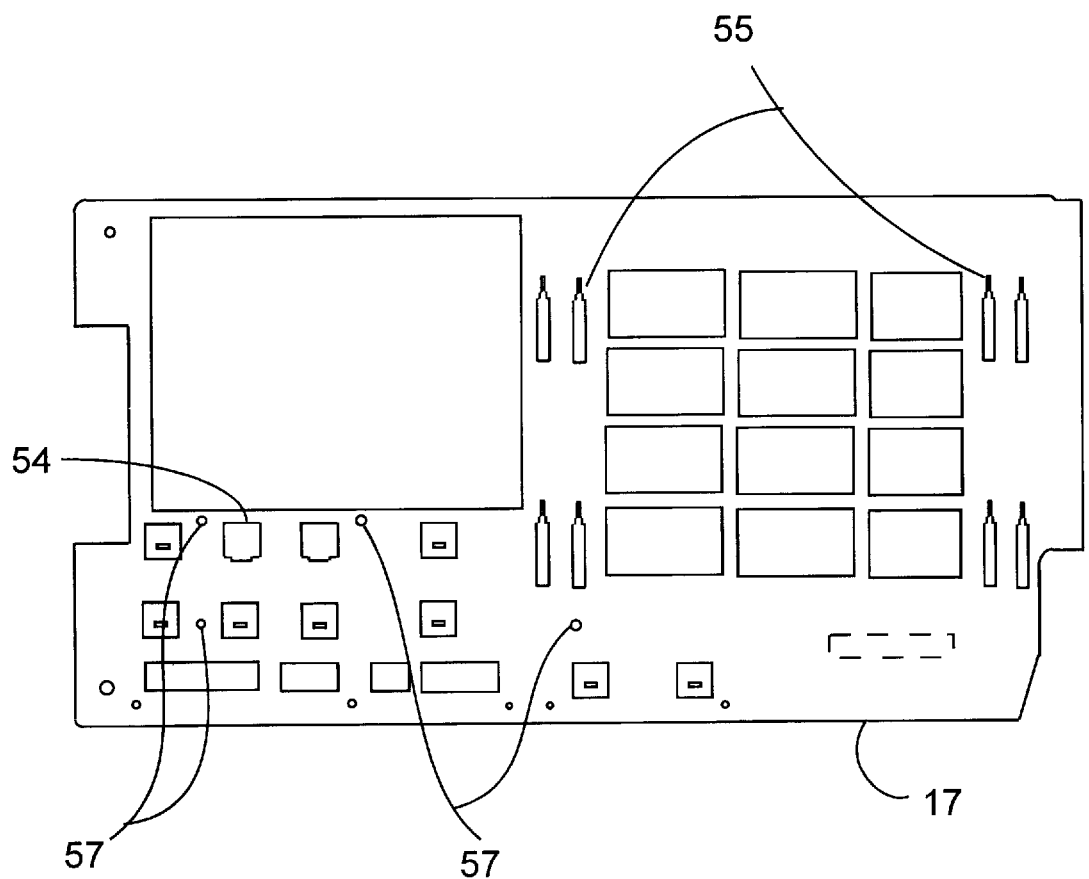
FIG. 7 illustrates a front elevational view of the vertical bulkhead of the present invention.

FIG. 7 illustrates the vertical bulkhead 17 of the present invention. This vertical bulkhead 17 includes a plurality of mounting locations 55 for a peripheral fan assembly. The vertical bulkhead 17 also includes a plurality of mounting locations 57 for a processor (CPU) fan assembly. Moreover, the vertical bulkhead 17 includes a plurality of clip receiving openings 54. The clips, used to couple a module rail to the vertical bulkhead 17, will be described hereinafter.

Figure 8:
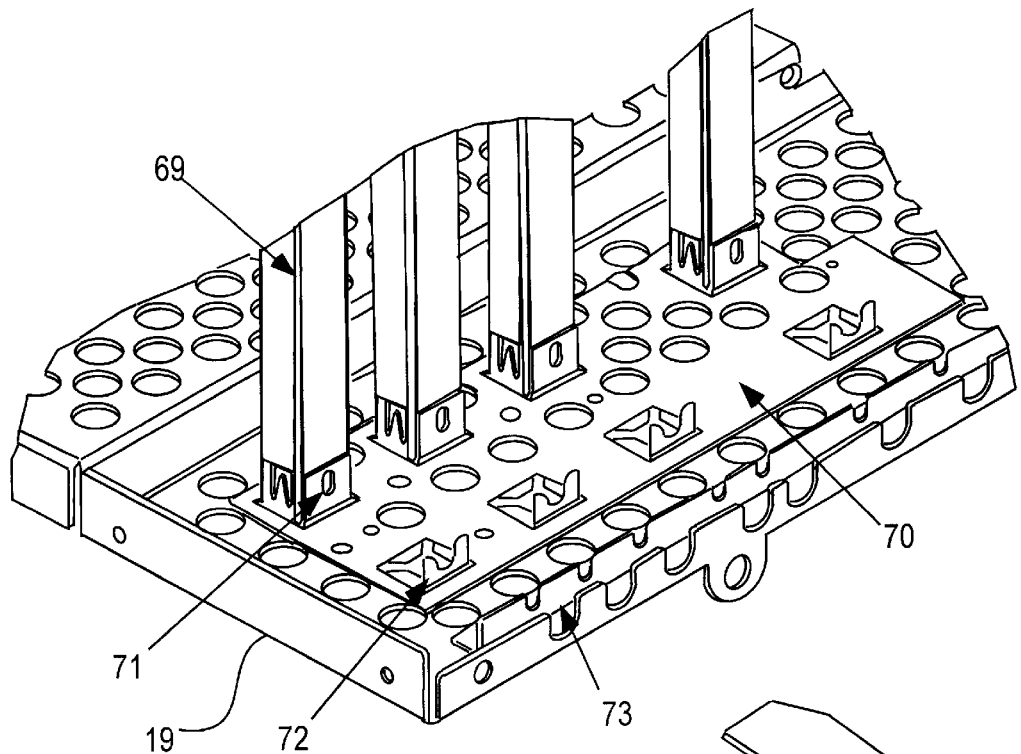
FIG. 8 illustrates an enlarged partial perspective view of how a module rail of the present invention is coupled to the rear I/O panel.

FIG. 8 illustrates how a module rail 69 is coupled to the rear I/O panel 19. The module rail 69 is coupled to the rear I/O panel 19 through a plate 70 having a plurality of first tabs 71 and second tabs 72. One simply couples the bracket (71,72) to an end of a module rail via screw or other coupling means (e.g. please provide).

The first tabs 71 are provided to support a module rail 69. The combination of the module rail 69 and first tabs 71 provide mechanical support to cards having an approximate height of 5 inches (e.g., 4.85 inch card). The second tabs 72 are provided to support a module rail 69, the combination of which provides mechanical support to a card having an approximate height of 6 inches (e.g., a 6.2 inch card). FIG. 8 also illustrates an extended bracket 73 that is provided to support a module rail, the combination of which provides mechanical support to a card having an approximate height of 7 inches (e.g., a 7.2 inch card).

Figure 9:
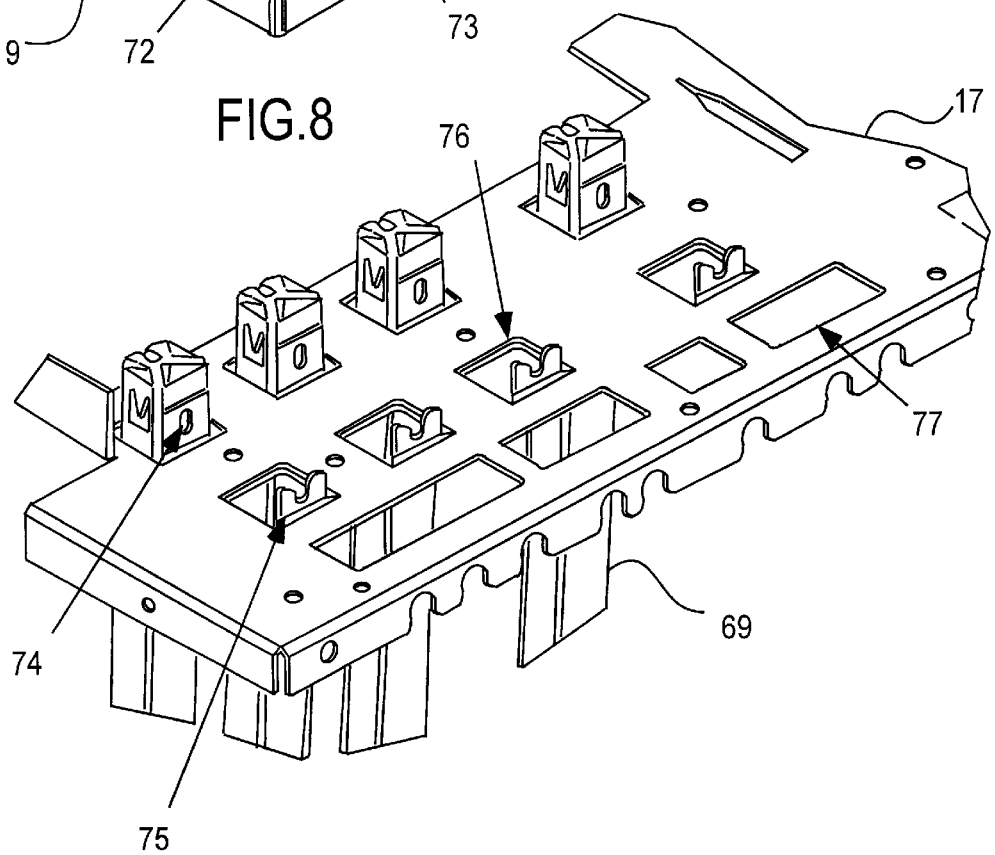
FIG. 9 illustrates an enlarged partial perspective view of how the module rail is coupled to the vertical bulkhead of the present invention.

FIG. 9 illustrates how the module rail 69 is coupled to the vertical bulkhead 17. The module rail 69 is coupled to the vertical bulkhead 17 via a first tab 74 or a second tab 75. Both types of these tabs are fixedly coupled to the vertical bulkhead 17 adjacent to openings 76.

The first tabs 74 are provided to support a module rail that provides mechanical support to a card having an approximate height of 5 inches (e.g. 4.85 inch card). The second tabs 75 are provided to support a module rail that provides mechanical support to a card having an approximate height of 6 inches (e.g. a 6.2 inch card). FIG. 9 also illustrates a plurality of openings 77 for receiving a module rail that provides mechanical support to a card having an approximate height of 7 inches (a 7.2 inch card).

FIG. 10 illustrates the module rail of the present invention. This module rail includes a module rail housing 69 for housing a card-receiving portion 79. The module rail is coupled to both the rear I/O patch panel and the vertical bulkhead. The main purpose of this module rail is to stabilize and to provide mechanical support to computer cards that are extending from the baseboard.

Figure 11A:
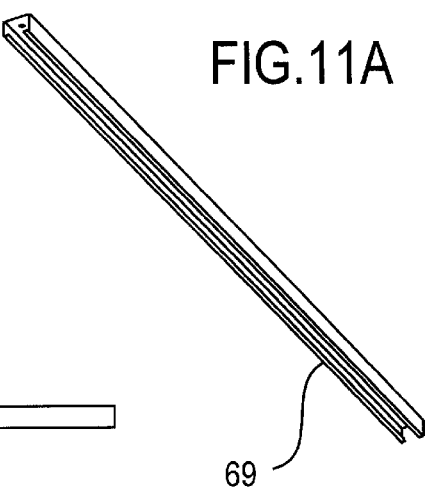
FIG. 11 illustrates a perspective view of a module rail housing.
Figure 11B:
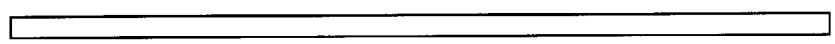
Figure 11C:

FIG. 11 illustrates a perspective view of the module rail housing 69 of the present invention.

FIG. 12A illustrates the card-receiving portion 79 of the module rail. FIG. 12B illustrates a cross sectional view of the card-receiving portion 79. The card-receiving portion 79 defines a grove for receiving an edge of computer cards 81.

FIG. 13 illustrates two types of openings formed in the vertical bulkhead and rear I/O panel 19 that are adapted to receive a module rail clip (described hereinafter with reference to FIGS. 14A–14C). The first opening 85 and the second opening 87 essentially serve the same functional purpose of removably coupling the clip to the vertical bulkhead 17 and rear I/O panel 19, respectively.

FIGS. 14A–14C illustrate different views of a module rail clip 95 of the present invention. The engagement of the primary tab 101 and the spring tabs 103 secure the module rail clip 95 to the vertical bulkhead 17 or rear I/O panel 19. The module rail 69 then fits into the void 105, where it can be secured.

FIG. 15 illustrates how a module rail clip is coupled to the vertical bulkhead 17.

Figure 16:
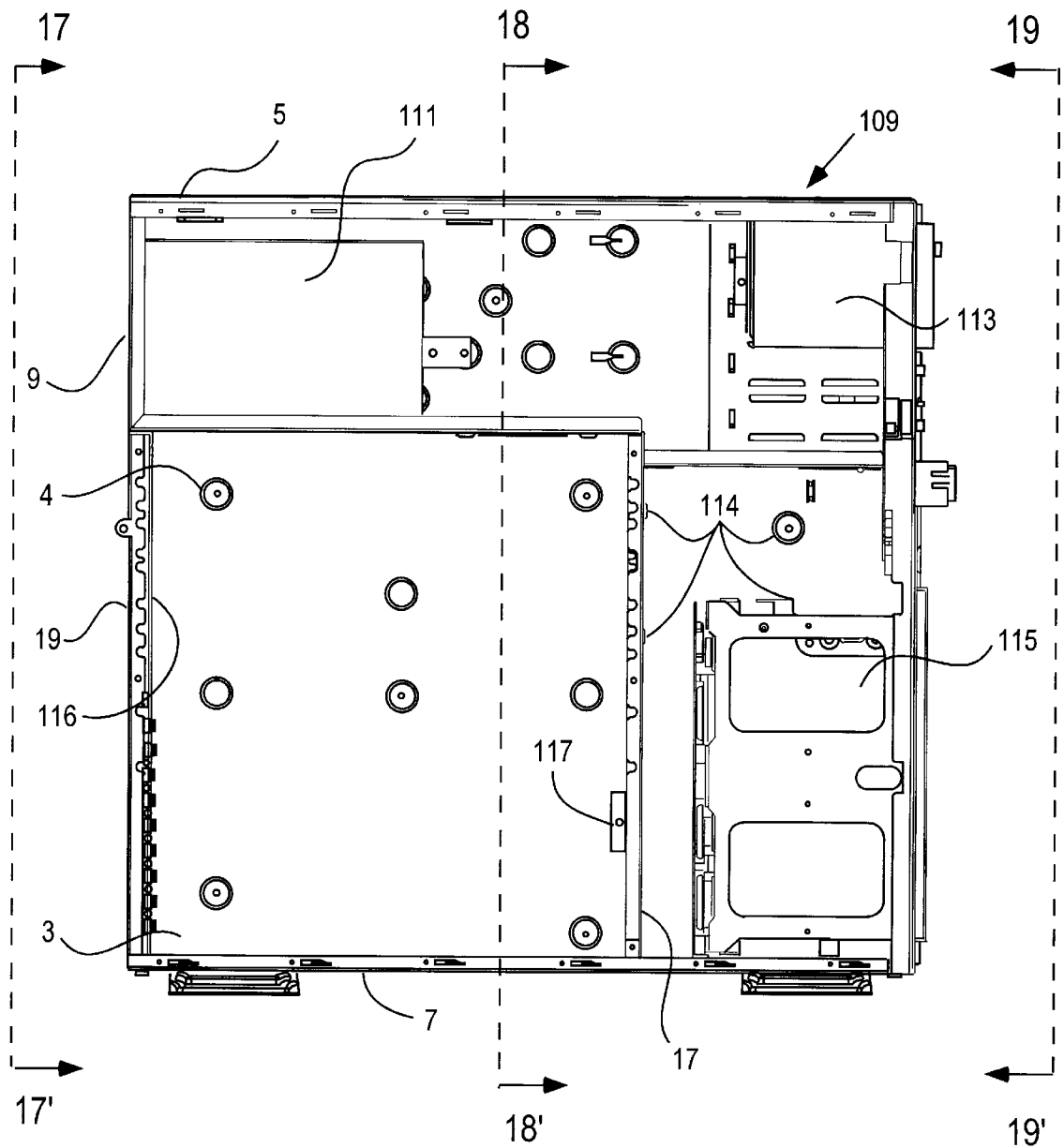
FIG. 16 illustrates a side elevational view of the chassis of the present invention.

FIG. 16 illustrates a side elevational view of the present invention. In this view, the area 3 for receiving the baseboard mounting plate can be seen more clearly. Also, the engagement embosses 6, disposed in the generally rectangular area 3, for receiving the baseboard mounting plate are further illustrated. The chassis of the present invention includes a power supply bracket (described hereinafter with reference to FIG. 46) for receiving power supplies (e.g., element 111) of different dimensions, a disk drive mounting plate 113 for receiving a plurality of disk drives, and a hard drive bracket 115 for receiving and holding a hard drive for the computer system. The rear I/O panel 19 includes a plurality of mounting locations for I/O patch panels (e.g., elements 37 and 38). The vertical bulkhead 17 includes a mounting location 117 for a plurality of different peripheral fan assemblies, which will be described in detail hereinafter. The chassis wrap 2 includes a plurality of mounting locations 118 for a plurality of different upper plastics assemblies, which will also be described in detail hereinafter. FIG. 16 also illustrates the mounting locations 119 for the different processor fan assemblies of the present invention.

Figure 17:
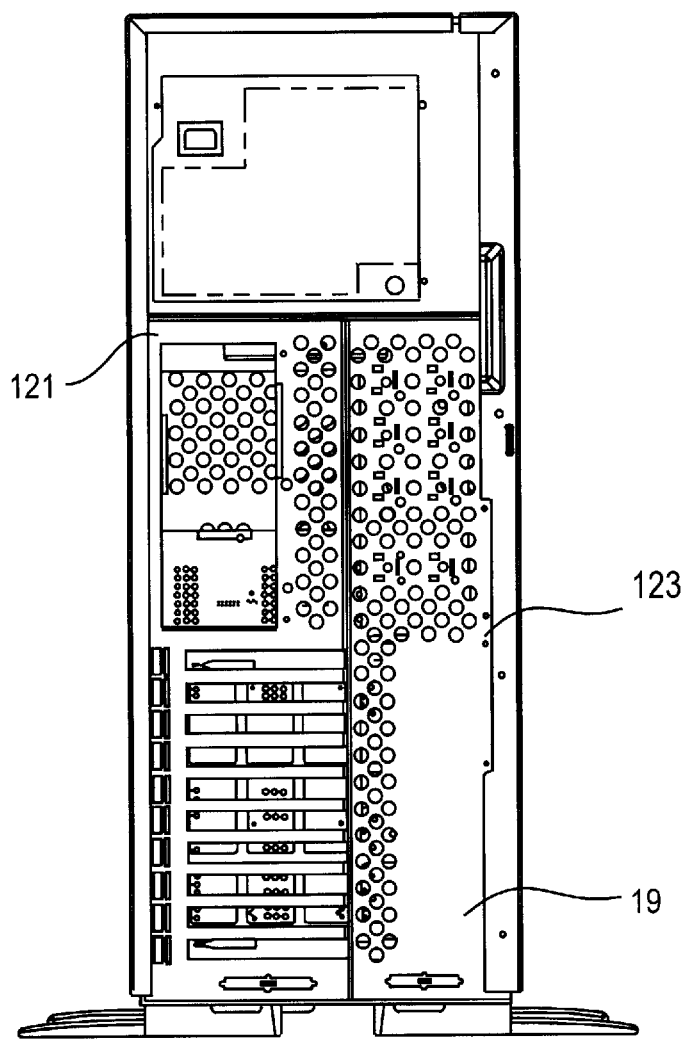
FIG. 17 illustrates a rear elevational view of the chassis of FIG. 16 along the line 17–17'.

FIG. 17 illustrates a rear elevational view of the chassis of FIG. 16 taken along 17–17'. The rear I/O panel 19 includes an area 121 for receiving a plurality of different I/O patch panels (e.g., elements 37 and 38). The rear I/O panel 19 also includes a plurality of mounting locations 123 for mounting the different I/O patch panels (e.g., elements 37 and 38).

Figure 18:
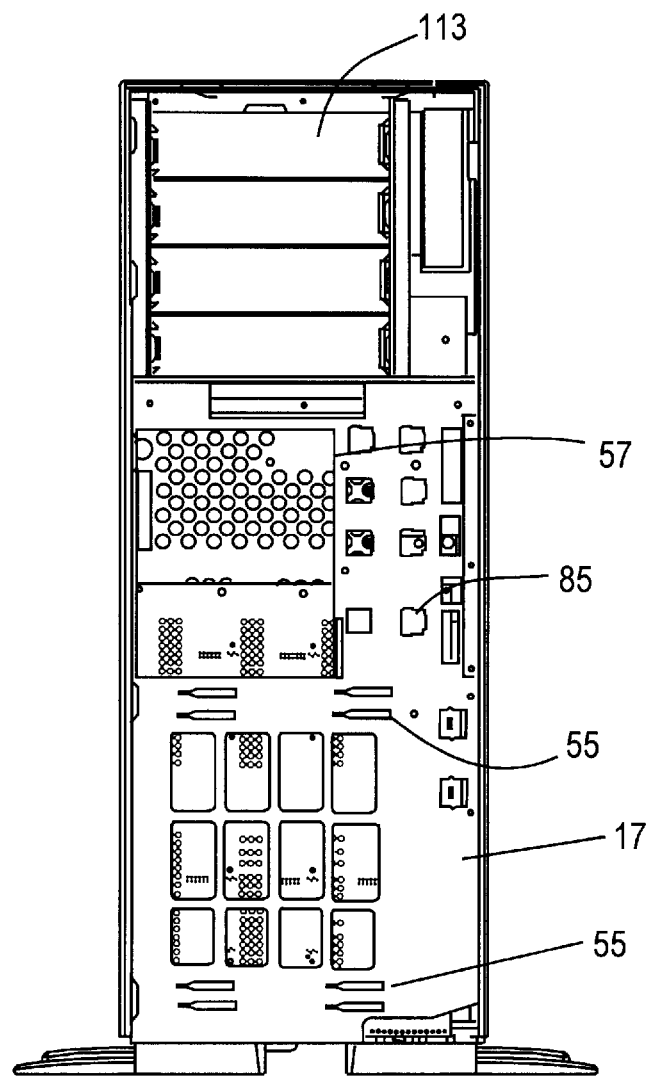
FIG. 18 illustrates a interior cross sectional view of the chassis of FIG. 16 along the line 18–18'.

FIG. 18 illustrates an interior cross sectional view of FIG. 16 along the line 18–18'. The vertical bulkhead 17 defines a plurality of peripheral fan assembly mounting locations 55 and a plurality of processor fan mounting locations 57 for use in mounting the respective fan assemblies.

Figure 19:
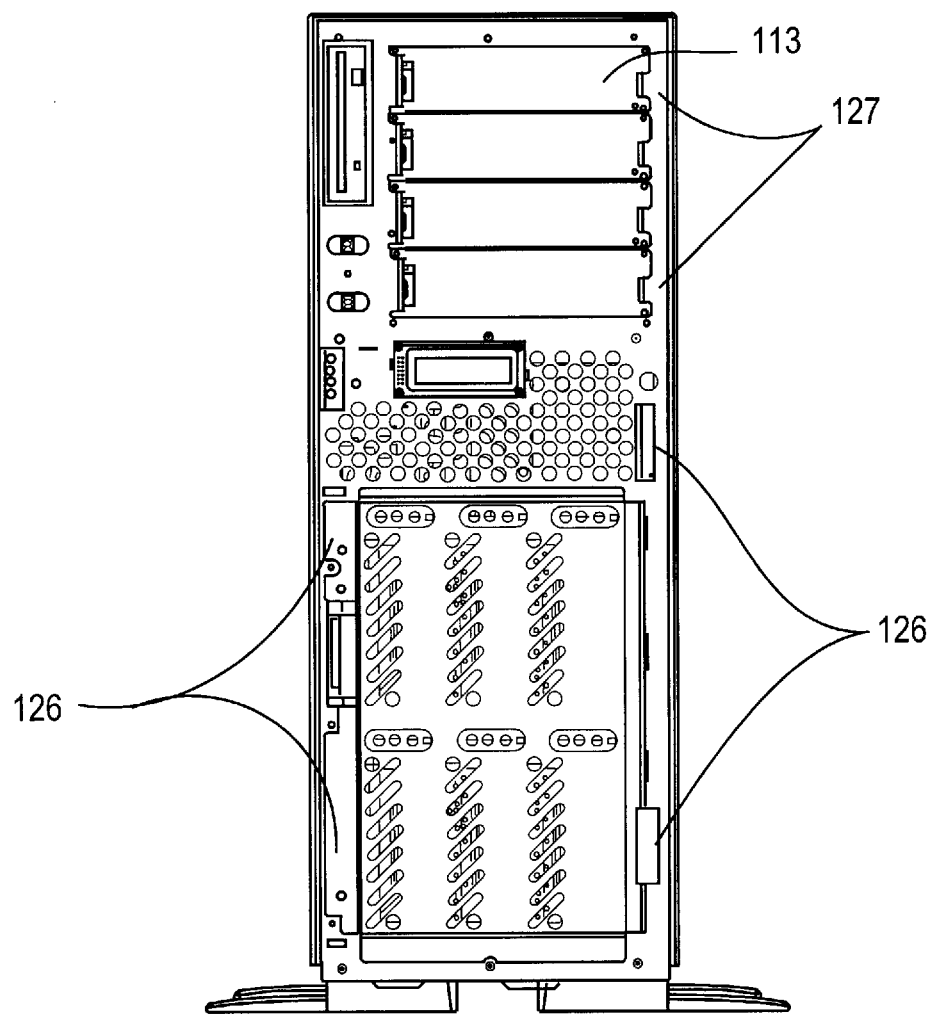
FIG. 19 illustrates a front elevational view of the chassis of FIG. 16 along line 19–19'.

FIG. 19 illustrates a front elevational view of the chassis of FIG. 16 along the line 19–19'. The front area 4 of the chassis wrap 2 includes a plurality of mounting locations 126 for a plurality of different lower plastics assemblies, which will be described in detail hereinafter. The front area 4 also includes a plurality of mounting locations 127 for a plurality of different upper plastics assemblies, which will also be described in detail hereinafter.

Figure 20:
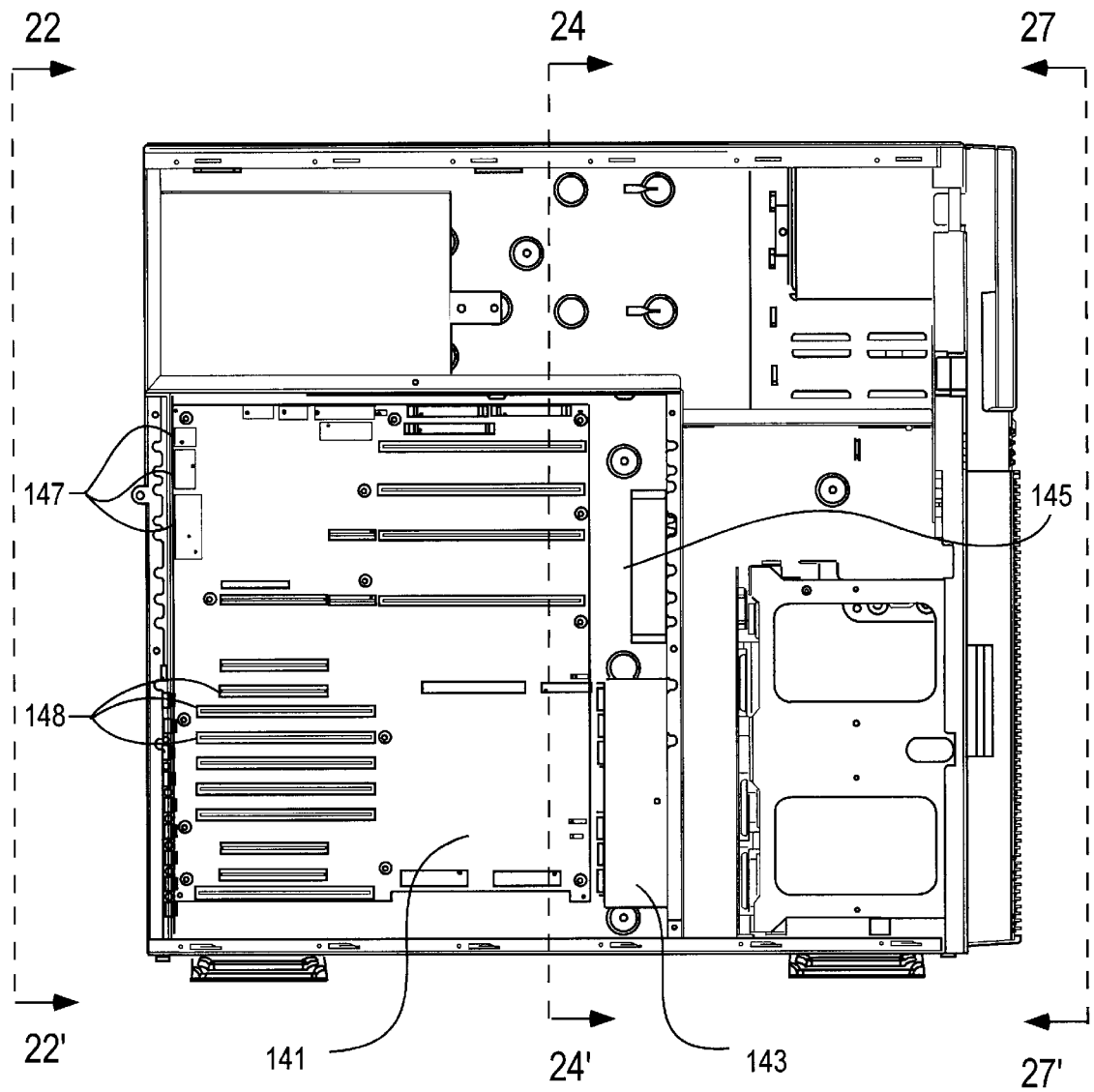
FIG. 20 illustrates a side elevational view of a first embodiment of the present invention.

FIG. 20 illustrates a side elevational view of a first embodiment of the present invention. The chassis shown in FIG. 20 includes a baseboard 141 having a first predetermined size (i.e., approximately 15 inches in length). This baseboard 141 is mounted and coupled directly to a specific baseboard mounting plate 151, which is behind the baseboard 141. This specific mounting plate 151 will be described in greater detail with reference to FIG. 21. It should be noted that the specific placement of the computer components on the baseboard (e.g., bus slots, processor, memory components, etc.) may vary from computer system to computer system. The baseboard 141 also includes I/O connectors 147, as well as bus slots 148 for receiving add-in computer cards. In the first embodiment, the computer system also includes a peripheral fan assembly 143 and a processor fan assembly 145 (each of these assemblies will be described in greater detail hereinafter).

Figure 21:
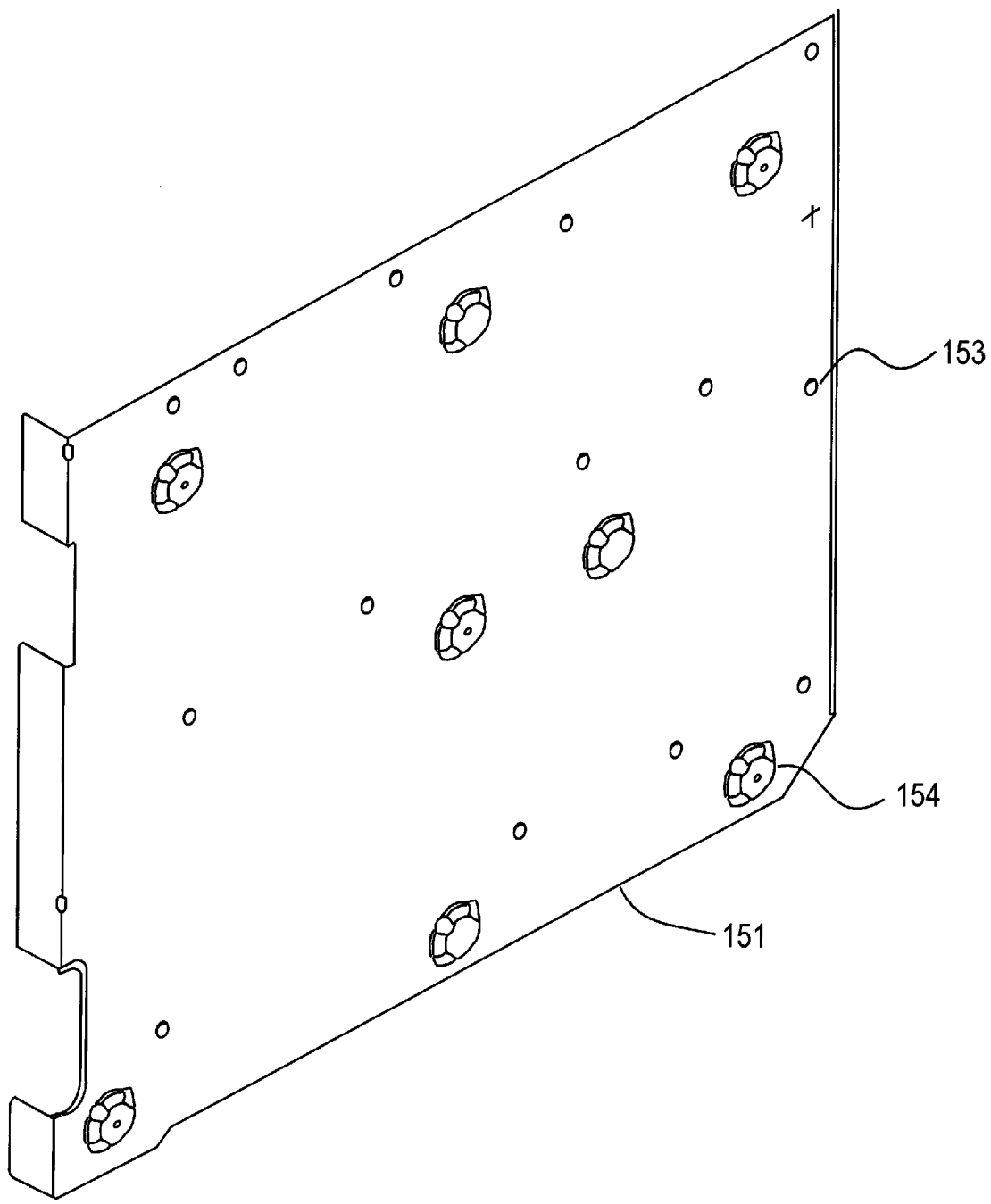
FIG. 21 illustrates a baseboard mounting plate for use in the first embodiment of the present invention.

FIG. 21 illustrates a perspective view of the baseboard mounting plate 151 that is associated specifically with the baseboard 141. The baseboard is mounted to the baseboard mounting plate 151 through the use of a plurality of mounting holes 153 in the mounting plate 151. The holes are disposed through the mounting plate 151 to correspond with similarly positioned holes disposed in the baseboard 141. Once the baseboard 141 is coupled to the baseboard mounting plate 151 via the mounting locations 153, the total assembly (the baseboard and the mounting plate) is mounted to the chassis wrap 2 via the plurality of receiving means 154.

Figure 22:
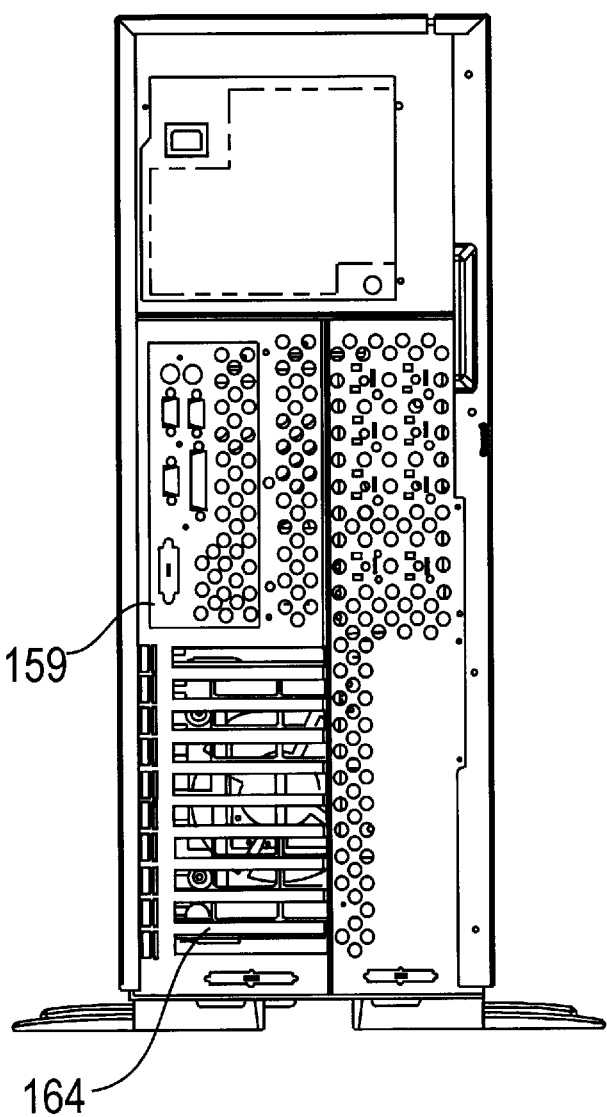
FIG. 22 illustrates a perspective view of a rear elevational view of the chassis, shown in FIG. 20, along the line 22–22'.

FIG. 22 illustrates a rear elevational view of the first embodiment of the present invention along line 22–22' of FIG. 20. FIG. 22 illustrates an I/O patch panel 159, that is specifically designed to adapt to the position of the connectors on the baseboard 141. The rear I/O panel 19 has a plurality of slots 164 for providing access of the computer cards to external devices, that are external to the computer chassis. One selects an appropriate number of 164 slots to match the number of computer cards that are coupled to the baseboard 141.

Figure 23:
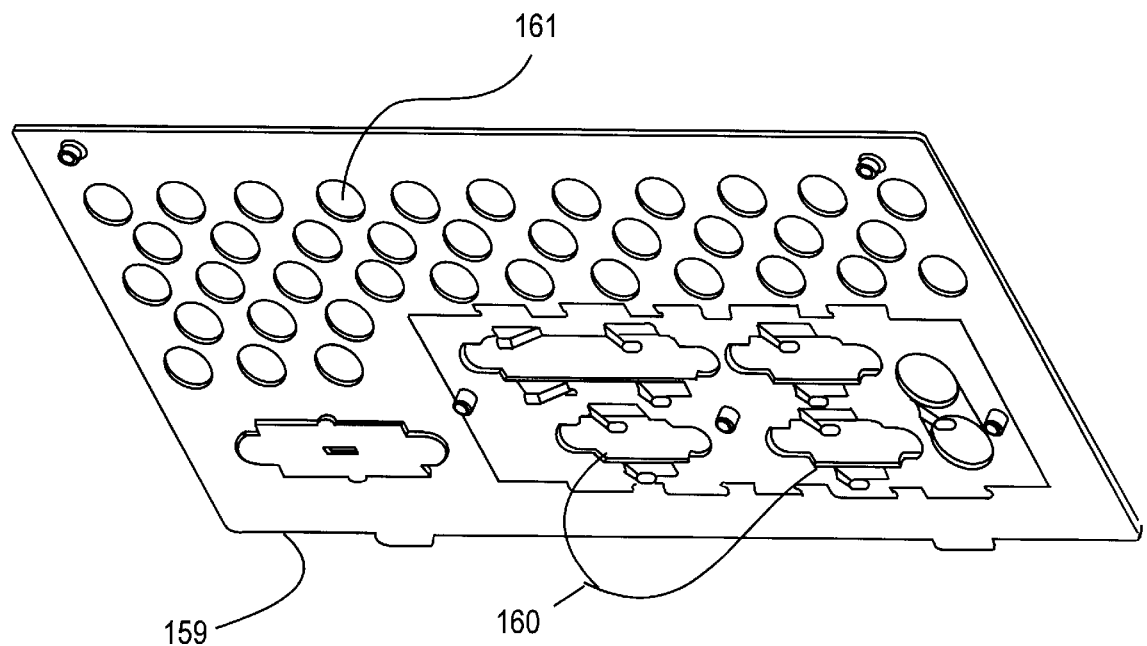
FIG. 23 illustrates an I/O patch panel for use in the first embodiment of the present invention.

FIG. 23 illustrates a perspective view of the I/O patch panel 159 of the first embodiment of the present invention. FIG. 23 illustrates a plurality of connector openings 160 having different sizes and shapes. As mentioned previously, this patch panel 159 also has a plurality of circular holes 161 for providing ventilation for the computer chassis.

Figure 24:
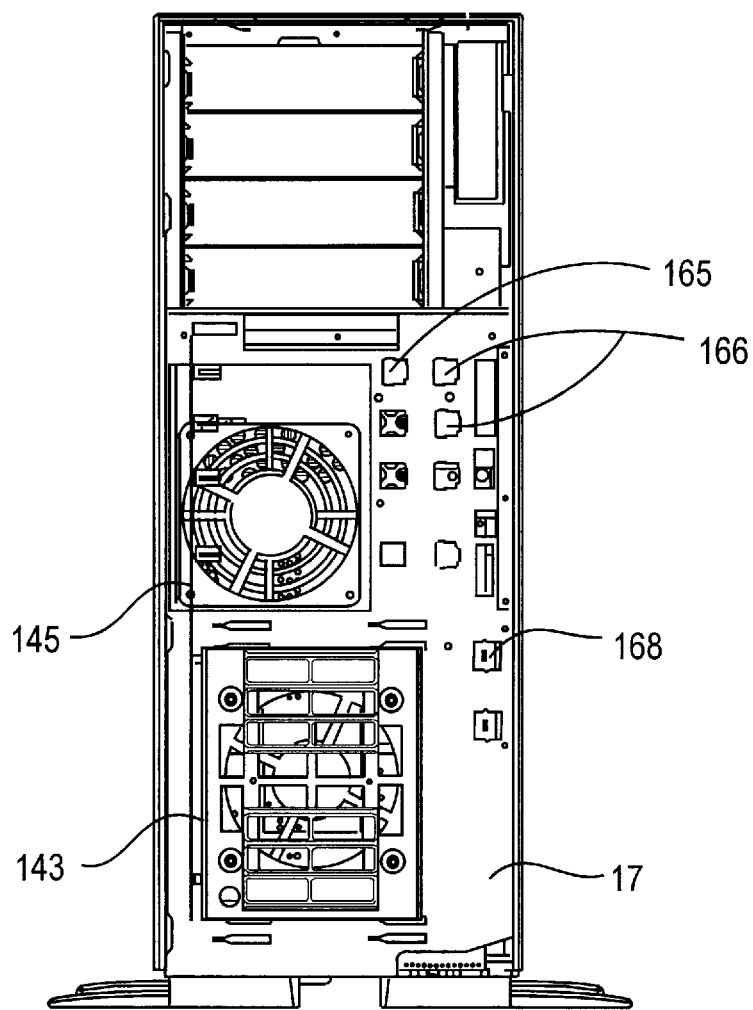
FIG. 24 illustrates an interior cross sectional view of the chassis of FIG. 20 along the line 24–24'.

FIG. 24 illustrates an interior cross-sectional view of the first embodiment of the present invention along the line 24–24' of FIG. 20. The vertical bulkhead 17 provides mounting locations for the peripheral fan assembly 143 and corresponding mounting locations for the processor fan assembly 145. The vertical bulkhead 17 also provides a plurality of mounting locations 165 for the module rail for a first pre-determined height. The vertical bulkhead 17 also includes a second set of mounting locations 166 for the module rail for cards of a second predetermined height. Similarly, the vertical bulkhead 17 provides a third set of mounting locations 168 for the module rail for cards of a third predetermined height.

Figure 25:
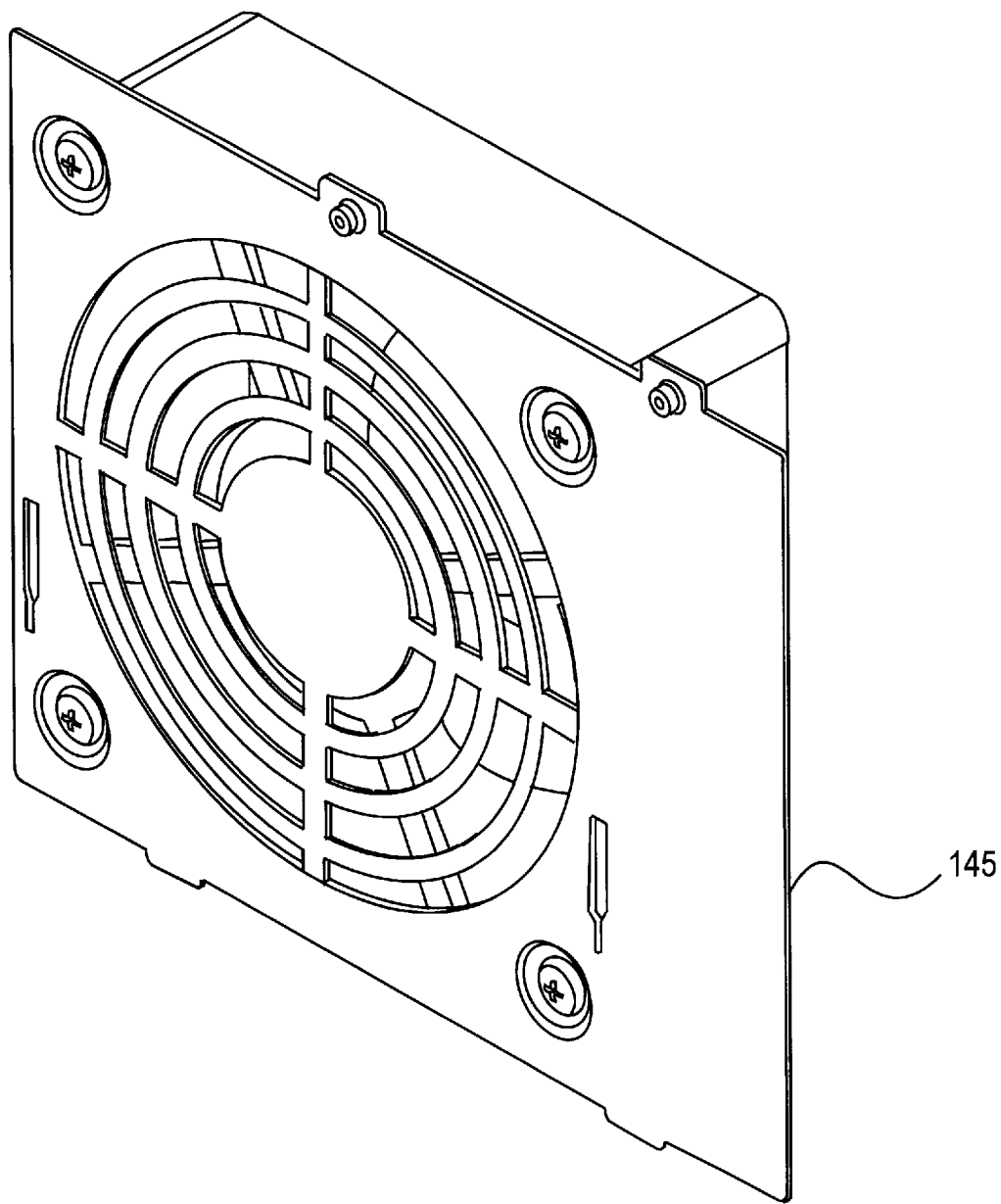
FIG. 25 illustrates a perspective view of a processor fan assembly to be used in the first and second embodiments of the present invention.
Figure 26:
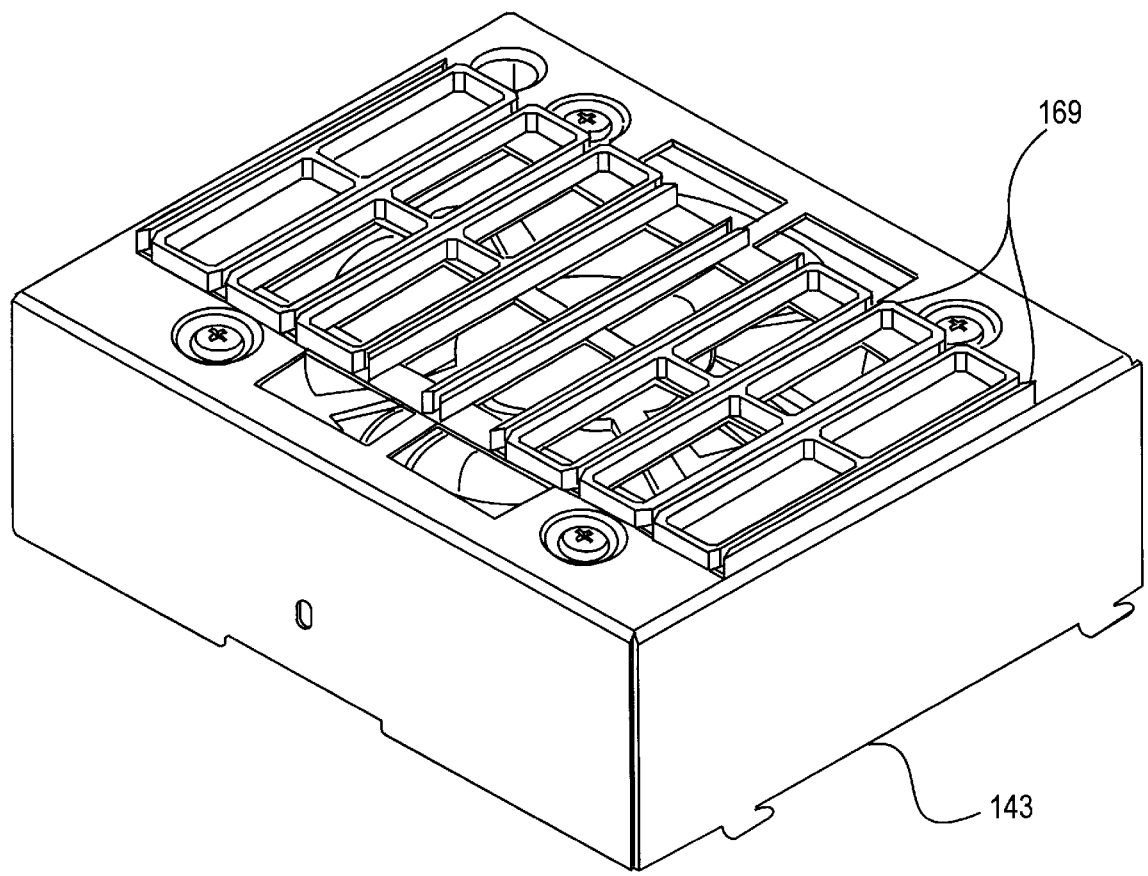
FIG. 26 illustrates a perspective view of a peripheral fan assembly for use in the first and second embodiments of the present invention.

FIG. 25 and FIG. 26 illustrate a processor fan assembly 145 and a peripheral fan assembly 143, respectively. These same assemblies 143, 145 are used in both the first and second embodiments of the present invention. It should be noted that the peripheral fan assembly 143 defines a plurality of card-holding slots 169 for supporting cards that are disposed on the baseboard 141. In this particular embodiment, the peripheral fan assembly 143 defines nine card-receiving slots.

Figure 27:
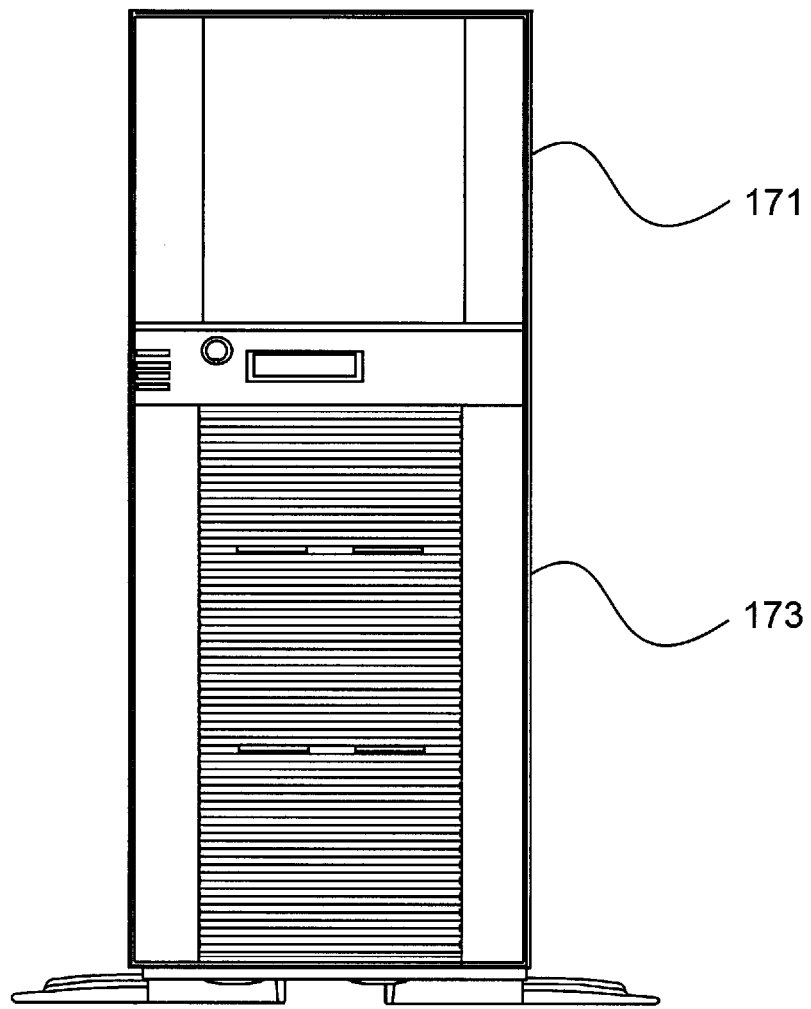
FIG. 27 illustrates a front elevational view of the chassis, as shown in FIG. 20, along the line 27–27'.
Figure 28:
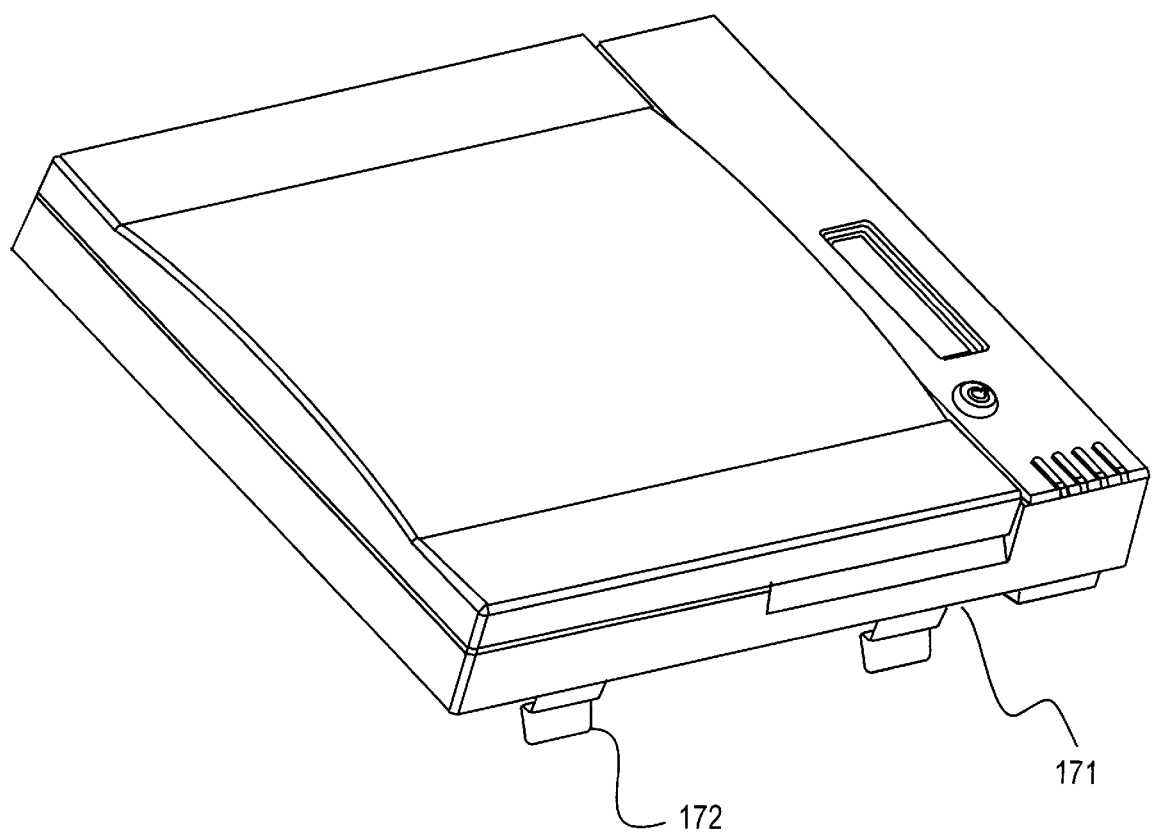
FIG. 28 illustrates a perspective view of an upper plastic assembly for use in the first and second embodiments of the present invention.

FIG. 27 illustrates a front elevational view of the first embodiment of the present invention along line 27–27' of FIG. 20. An upper plastics assembly 171 and a lower plastics assembly 173 corresponding to the first embodiment of the present invention is shown. FIG. 28 shows a perspective view of the upper plastics assembly for the first and second embodiments of the present invention. The upper plastics assembly 171 includes two clips 172 for attaching to the chassis wrap at the locations previously noted.

Figure 29:
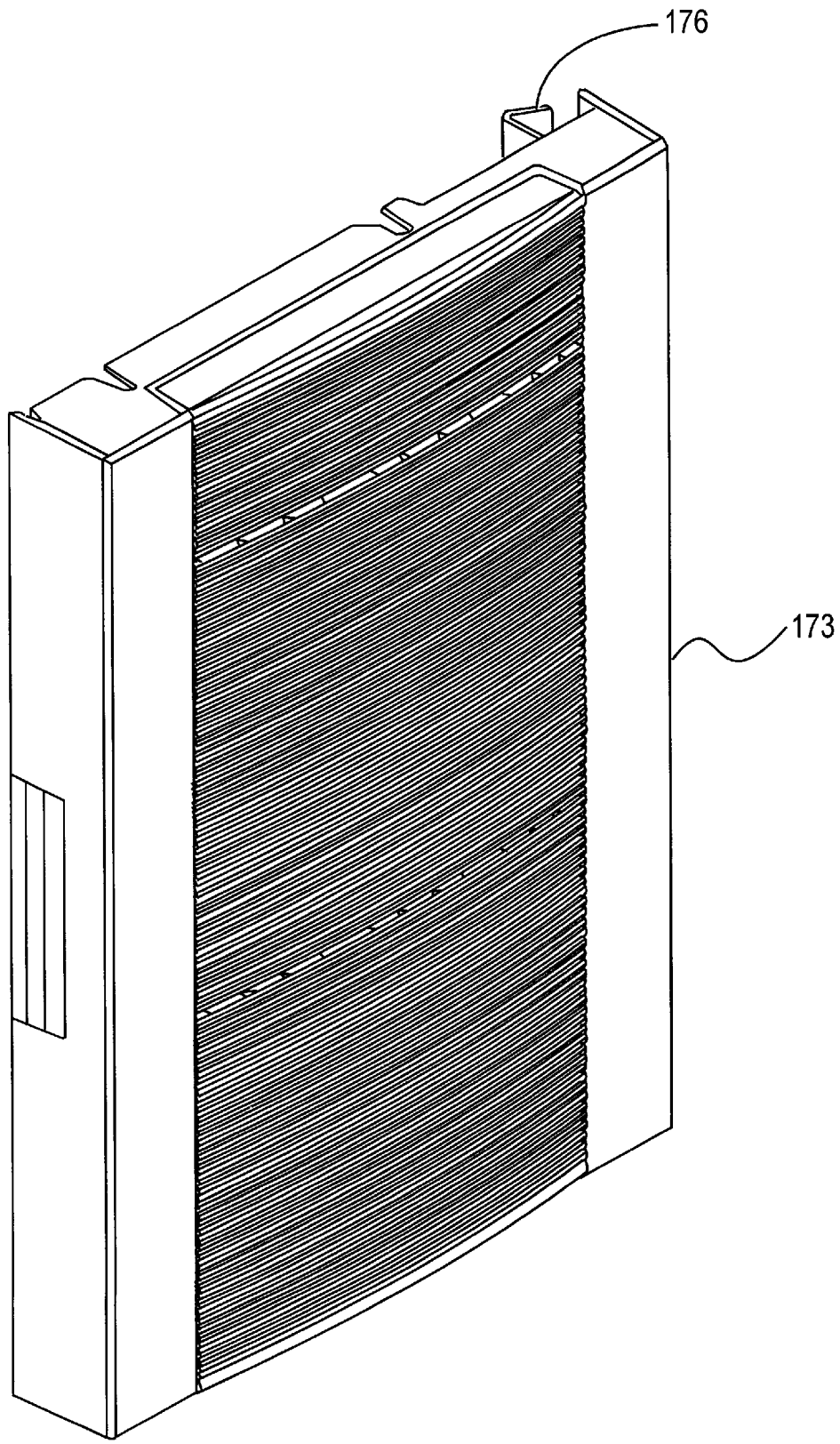
FIG. 29 illustrates a perspective view of a lower plastic assembly for use in the first and second embodiments of the present invention.

FIG. 29 illustrates a perspective view of the lower plastics assembly 173 for use in the first and second embodiments of the present invention. The lower plastics assembly includes a spring clip (not shown) for engaging the chassis wrap 2 and an extended clip portion 176 for attaching to the chassis wrap 2 at the previously described locations.

Figure 30:
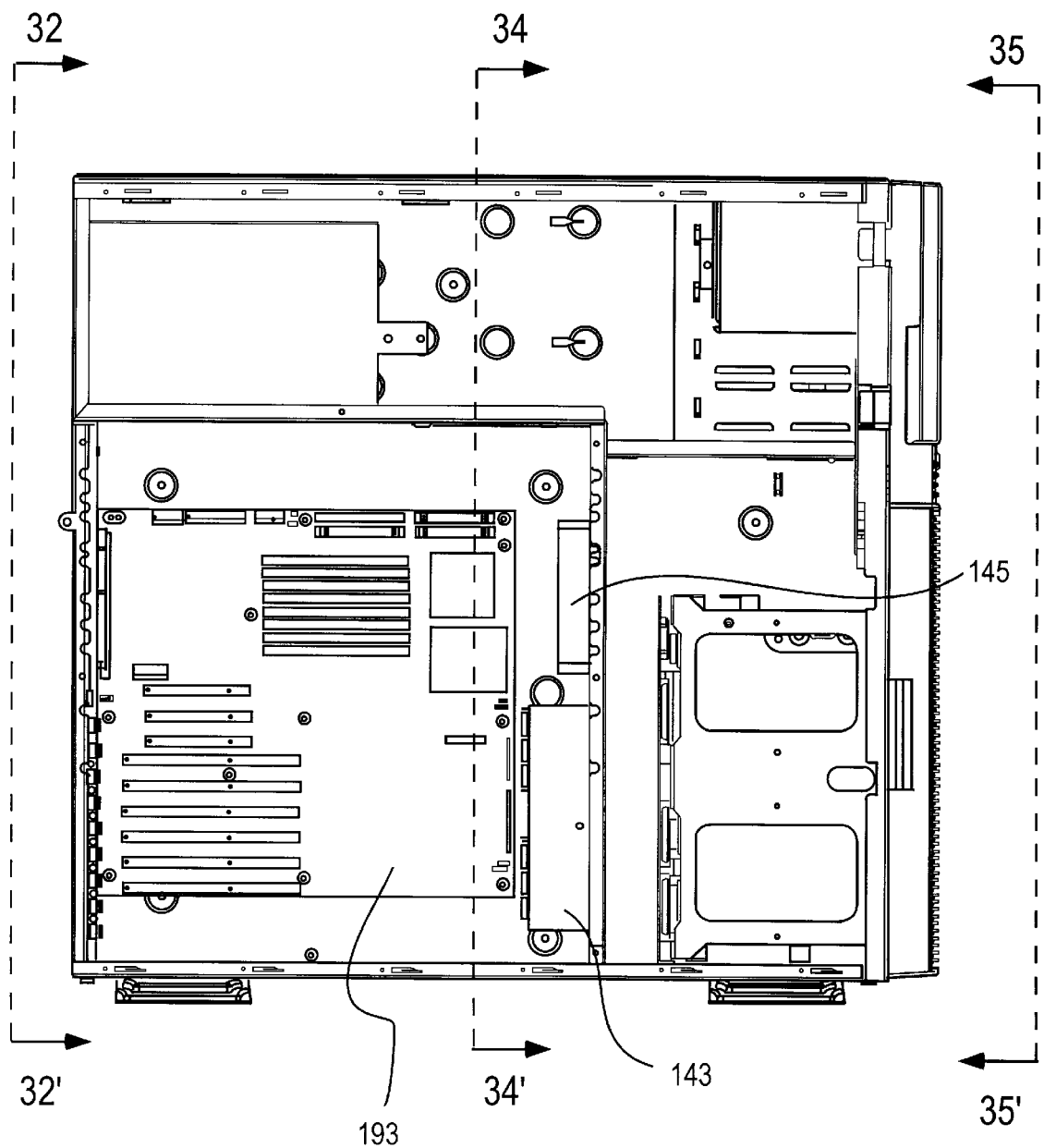
FIG. 30 illustrates a side elevational view of a second embodiment of the present invention.

FIG. 30 illustrates a side elevational view of a second embodiment of the present invention. In this embodiment, a second baseboard 193 having a second predetermined size (i.e., approximately 12 inches in length) is housed in the chassis. The layout of the computer components on baseboard 193 is different from the first baseboard (e.g., the location of bus slots, and the input/output connectors are different). In this second embodiment of the present invention, the peripheral fan assembly 143 and a processor fan assembly 145 are identical to that used in the first embodiment.

Figure 31:
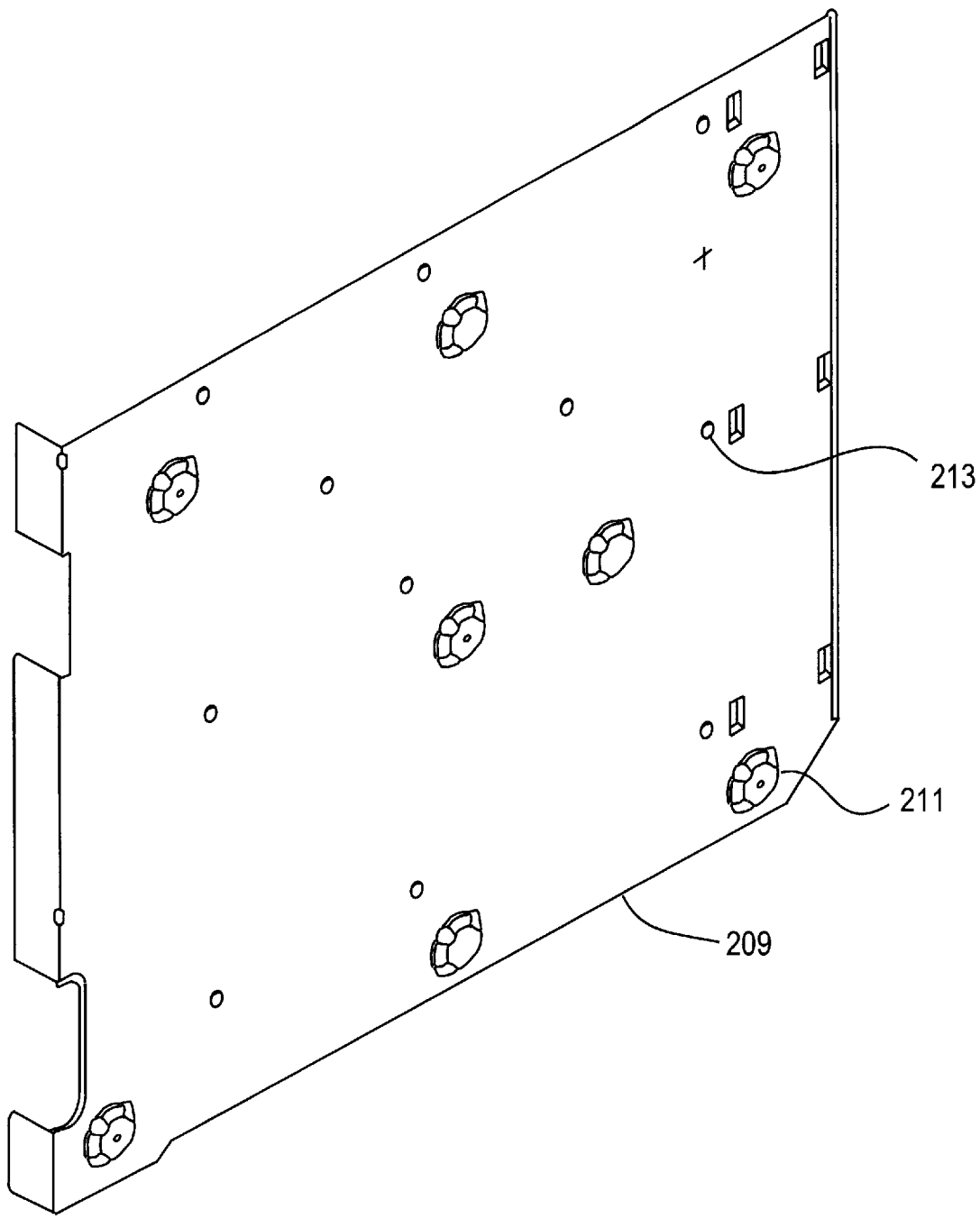
FIG. 31 illustrates a perspective view of a baseboard mounting plate for use in the second embodiment of the present invention.

FIG. 31 illustrates a perspective view of baseboard mounting plate 209 that is specifically designed to adaptively receive and couple to the baseboard 193. As is evident from FIG. 31, although the locations 211 for mounting the baseboard mounting plate 209 to the chassis wrap are similarly situated, when compared to the baseboard mounting plate of the first embodiment 151, the mounting locations for coupling the baseboard mounting plate 209 to the baseboard 193 are different.

Figure 32:
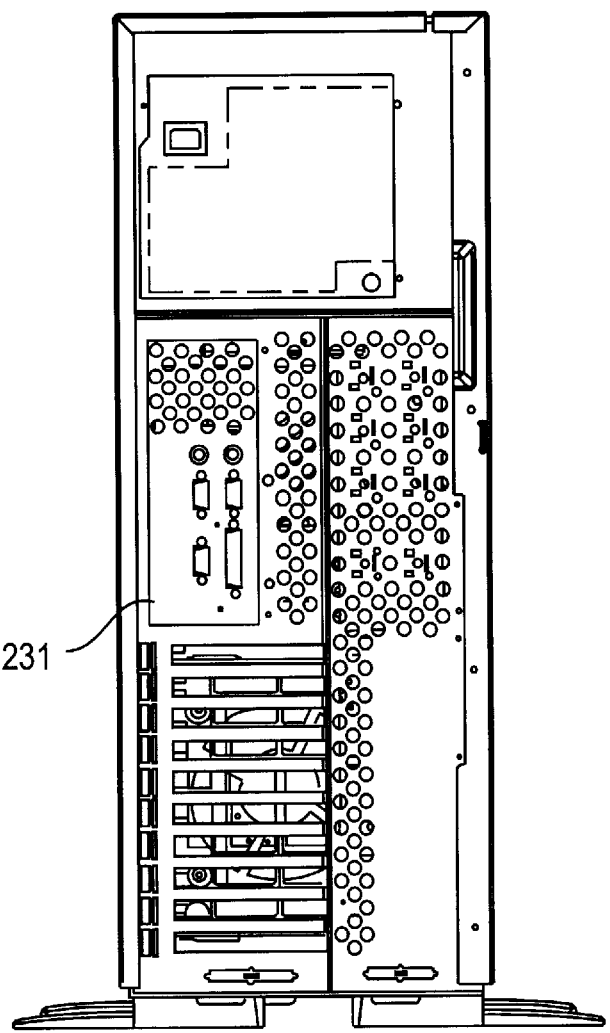
FIG. 32 illustrates a rear elevational view of the chassis, as shown in FIG. 30, along the line 32–32'.
Figure 33:
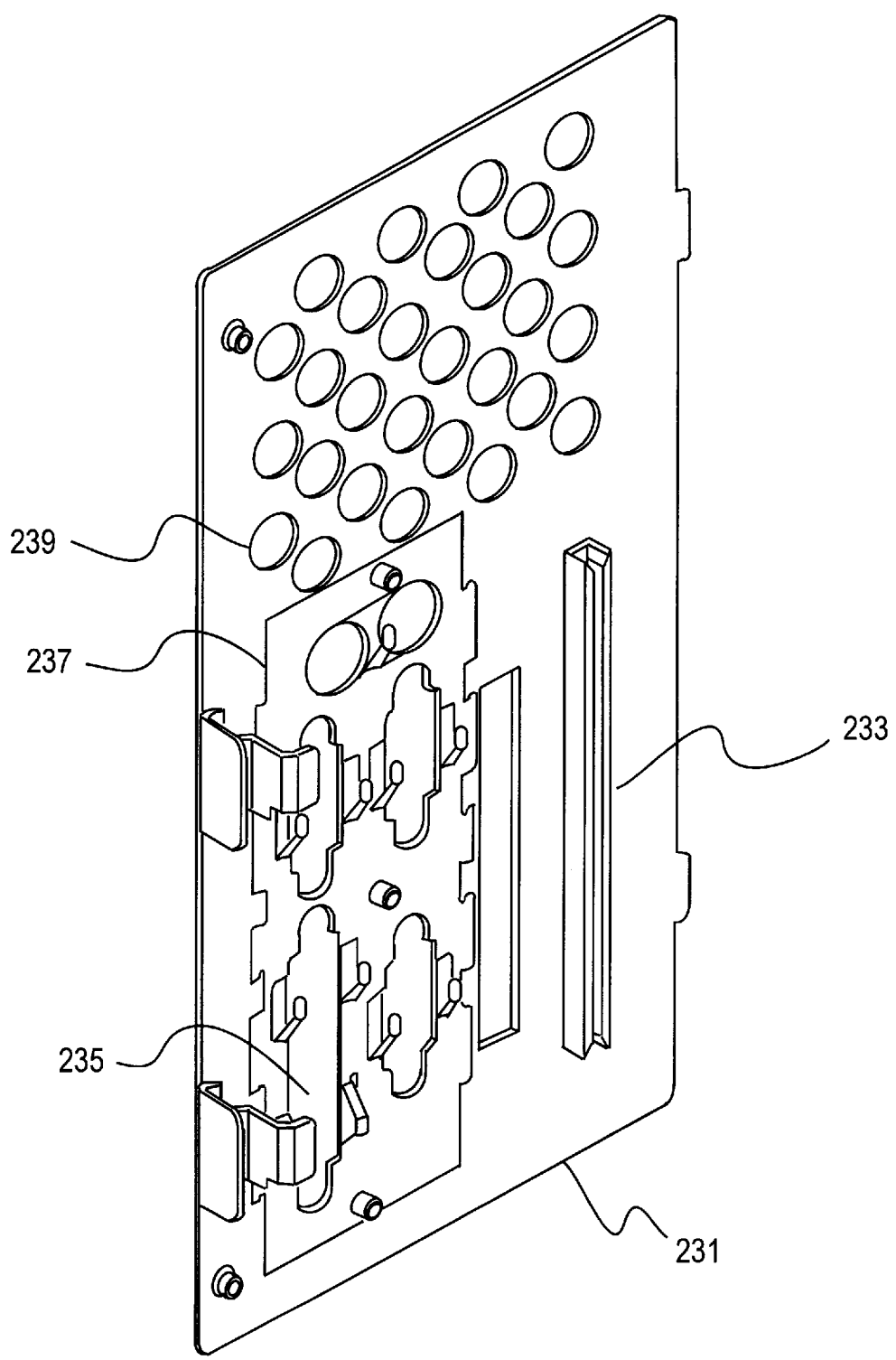
FIG. 33 illustrates an I/O patch panel for use in the second embodiment of the present invention.

FIG. 32 illustrates a rear elevational view of the second embodiment of the present invention along line 32–32'. The rear I/O patch panel 231, used in the second embodiment of the present invention, is different from the I/O patch panel used in the first embodiment. FIG. 33 illustrates an enlarged perspective view of the I/O patch panel 231. This patch panel 231 includes a plurality of different sized connector openings 235 for receiving connectors of different sizes. This I/O patch panel 231 also includes a plurality of circular perforations 239 for ventilation purposes. Also, a card-receiving slot 233 for stabilizing the baseboard 193 is also provided as part of the I/O patch panel 231. Circular connector openings 237 are also defined by the I/O patch panel 231.

Figure 34:
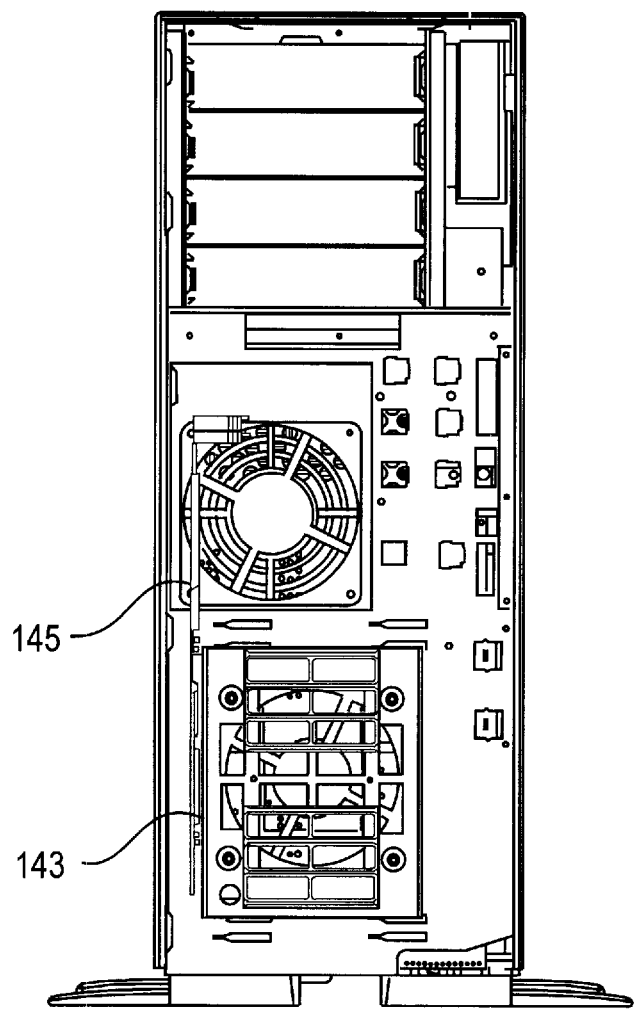
FIG. 34 illustrates an interior cross sectional view of the chassis, as shown in FIG. 30, along the line 34–34'.

FIG. 34 illustrates an interior cross-sectional view of the second embodiment of the present invention along line 34–34'. This view illustrates how the peripheral fan assembly 143 and the processor fan assembly 145 are coupled to the vertical bulkhead 17.

Figure 35:
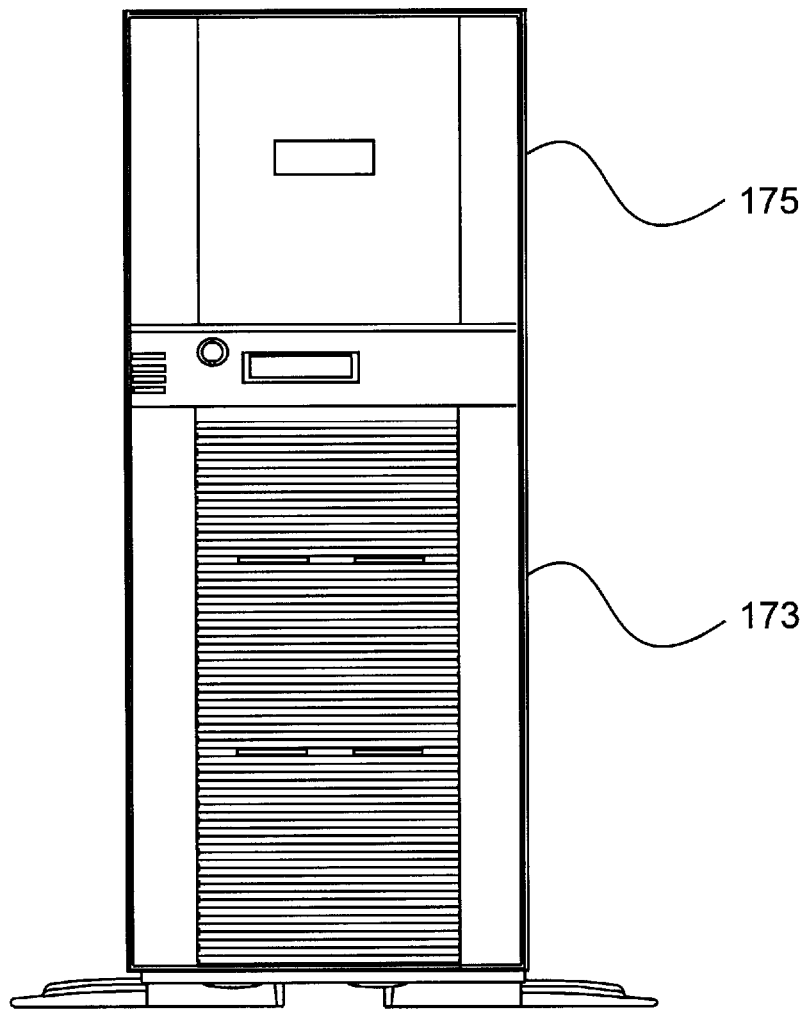
FIG. 35 illustrates a front elevational view of the chassis, as shown in FIG. 30, along the line 35–35'.

FIG. 35 illustrates a front elevational view of the second embodiment of the present invention. As is evident from FIG. 35 are identical to the assemblies used in the first embodiment of the present invention.

Figure 36:
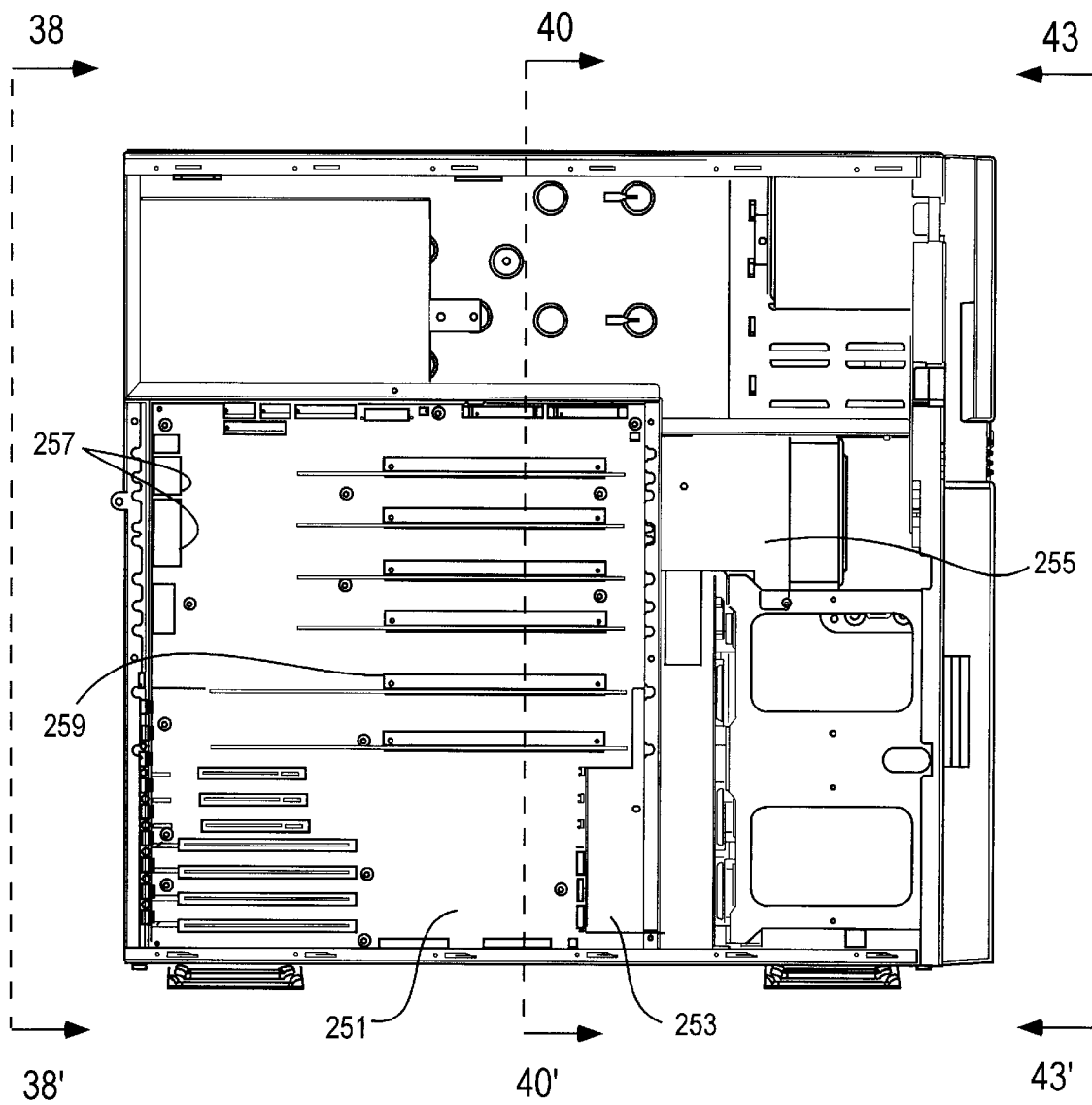
FIG. 36 illustrates a side elevational view of a third embodiment of the present invention.

FIG. 36 illustrates a side elevational view of a third embodiment of the present invention. In this embodiment, a third baseboard 251 having dimensions that are greater than the baseboard used in the first and second embodiment is housed in the computer chassis (i.e., approximately 20 inches in length). Since the placement of the computer components on this particular baseboard 251 are different from the two baseboards previously discussed, the output connectors 257, as well as the CPU and memory slots 259 are disposed in different locations on the baseboard 251. Moreover, in this embodiment, the peripheral fan assembly 253 is different from the assemblies described previously. Also, the processor fan assembly 255 is different from those previously described. The fan assemblies will be described greater detail hereinafter.

Figure 37:
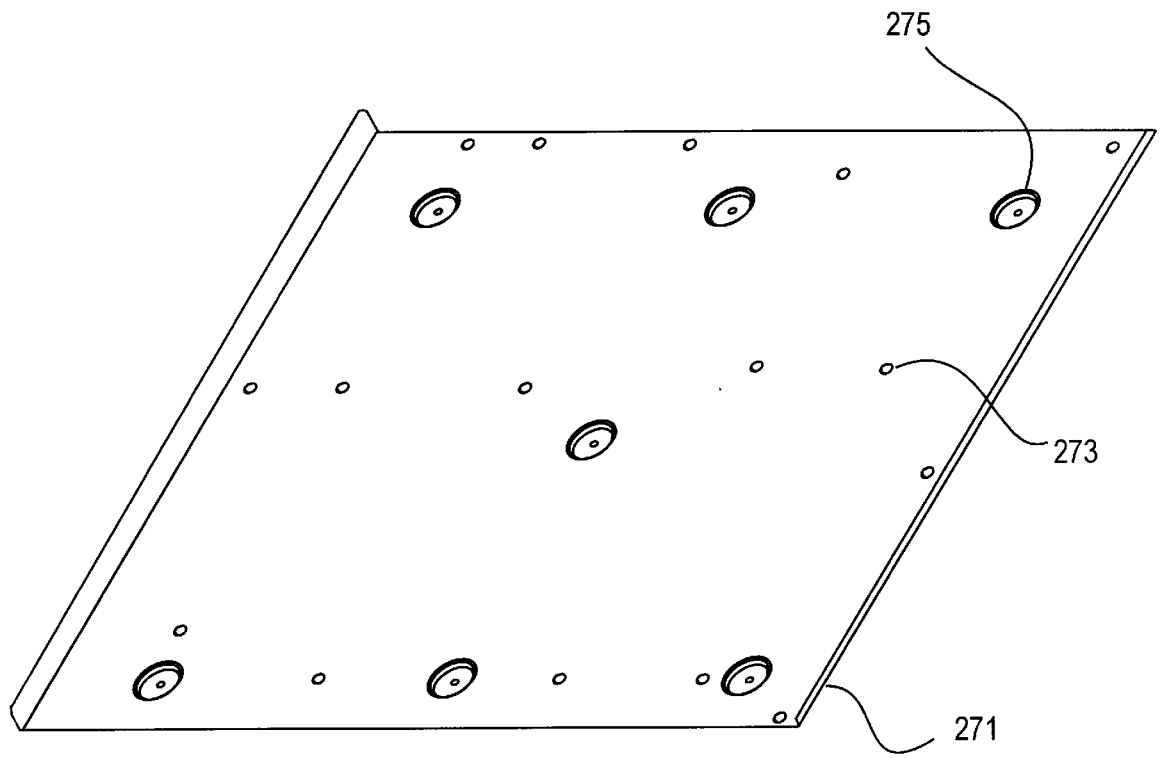
FIG. 37 illustrates a perspective view of a baseboard mounting plate for use in the third embodiment of the present invention.

FIG. 37 illustrates a perspective view of the baseboard mounting plate 271 that is specifically adapted to couple to the baseboard 251 in the third embodiment of the present invention. As noted previously, whereas the mounting locations 275 for coupling the baseboard mounting plate 271 to the chassis wrap are similarly situated in all three of these embodiments, the mounting locations for coupling the baseboard mounting plate 271 to the baseboard 251 are different. It should be noted that the plurality of mounting locations 273 for coupling the baseboard mounting plate 271 to the baseboard 251 correspond identically to the locations on the baseboard 251.

Figure 38:
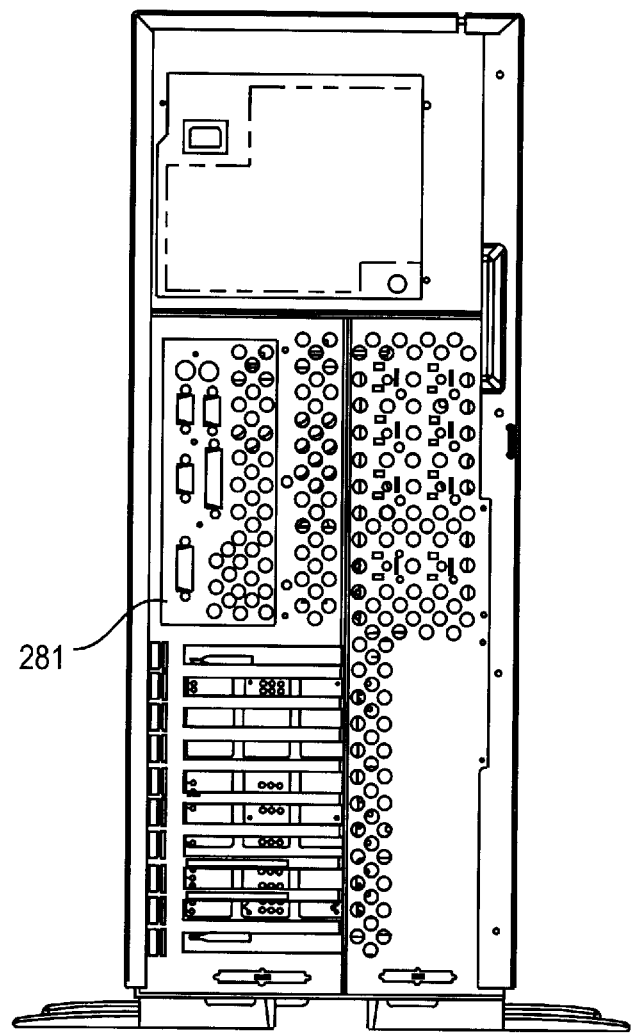
FIG. 38 illustrates a rear elevational view of the chassis, as shown in FIG. 36, along the line 38–38'.

FIG. 38 illustrates a rear elevational view of the third embodiment of the present invention along line 38–38'. This view illustrates a specific I/O patch panel 281 for use in the third embodiment of the present invention.

Figure 39:
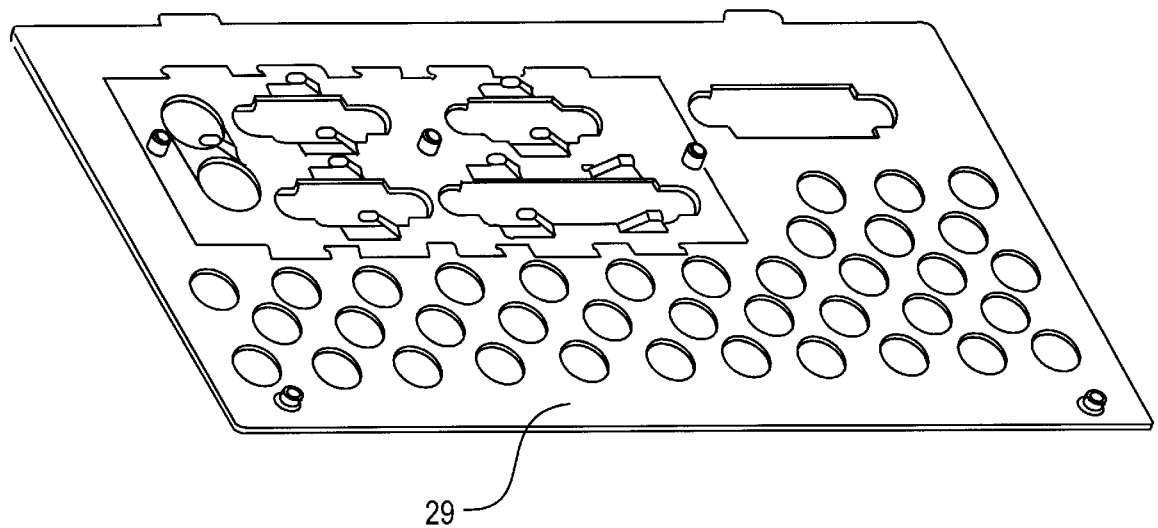
FIG. 39 illustrates a I/O patch panel for use in the third embodiment of the present invention.

FIG. 39 illustrates in greater detail the particular perforations defined by the I/O patch panel 281.

Figure 40:
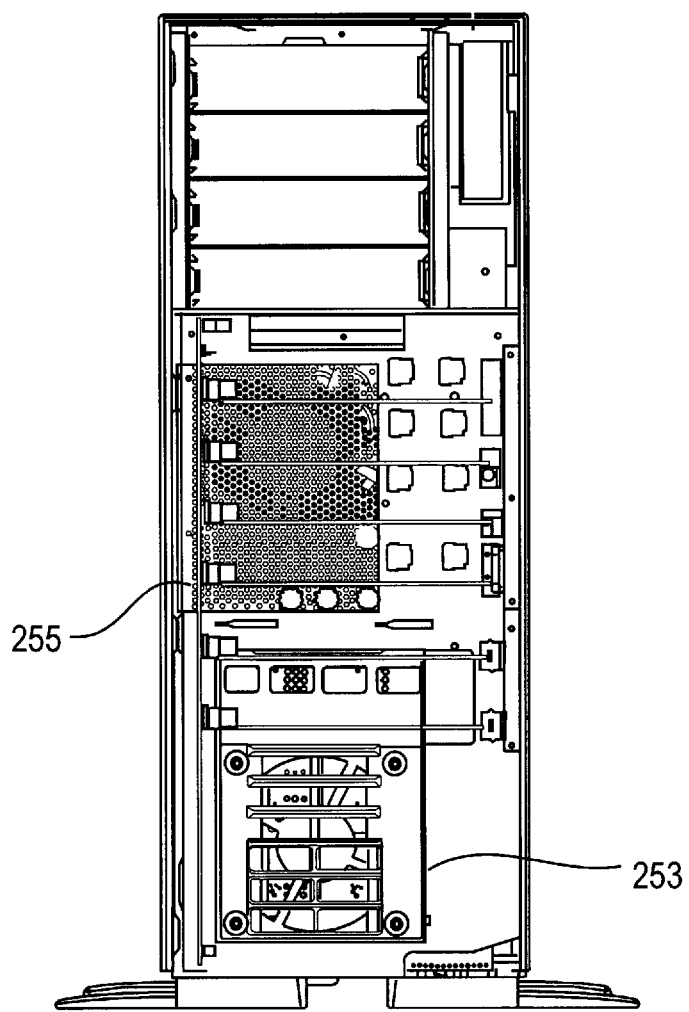
FIG. 40 illustrates an interior cross-sectional view of the chassis, as shown in FIG. 36, along the line 40–40'.

FIG. 40 illustrates an interior cross-sectional view of the third embodiment of the present invention along line 40–40' of FIG. 36. It should be noted that the peripheral fan assembly 253 is mounted on different mounting locations than in the first and second embodiments. Similarly, the processor fan assembly 255 is mounted using different mounting locations than the first and second embodiment.

Figure 41:
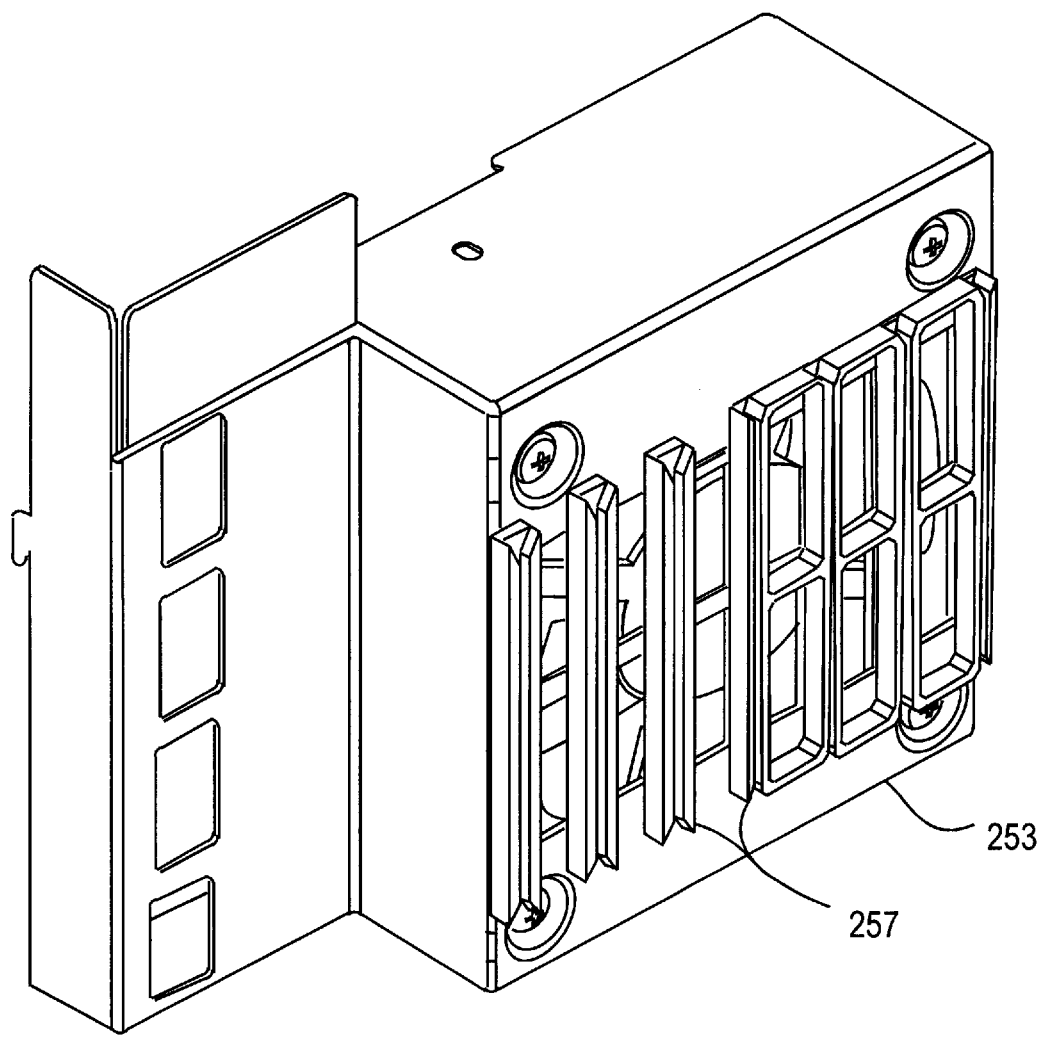
FIG. 41 illustrates a perspective view of a peripheral fan assembly for use with the third embodiment of the present invention.
Figure 42:
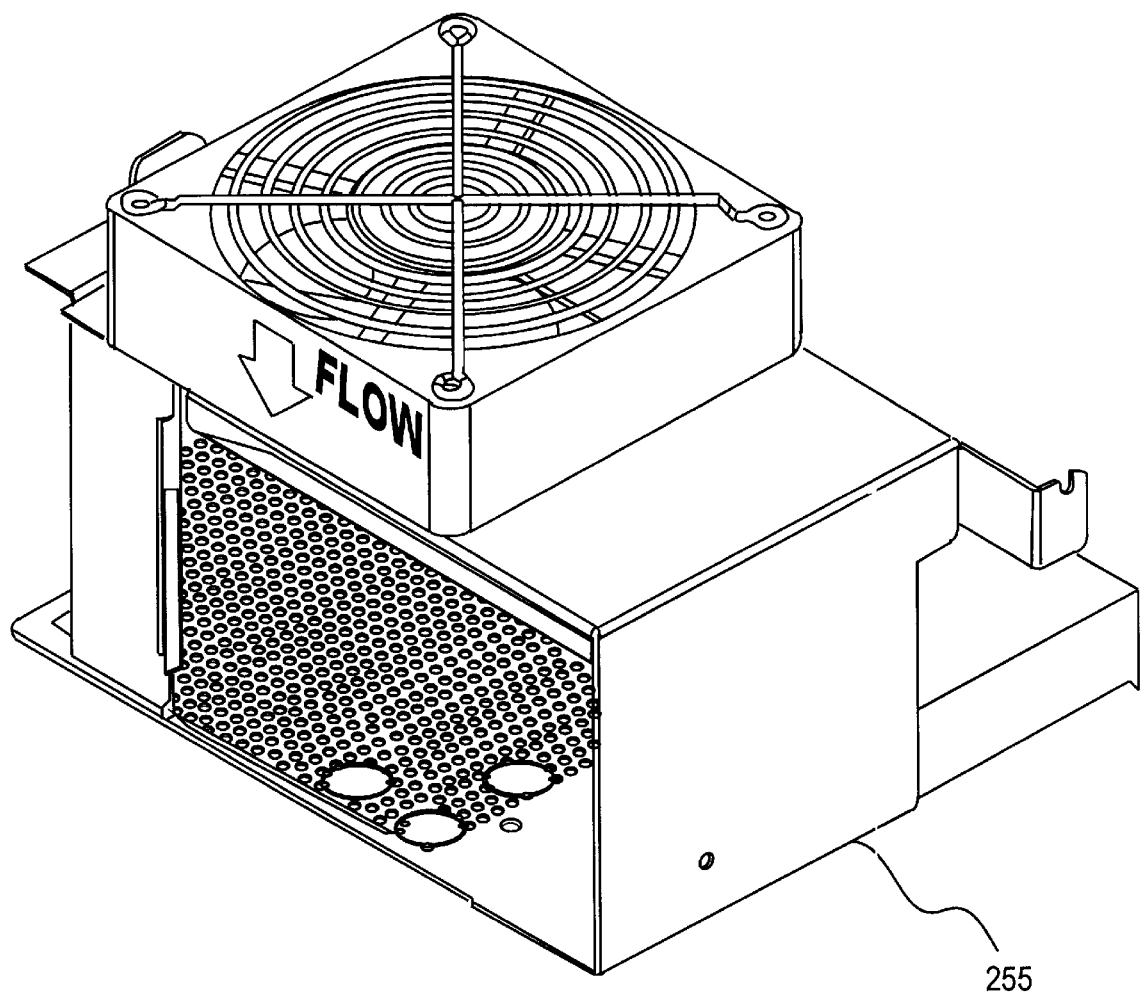
FIG. 42 illustrates a perspective view of a processor fan assembly for use with the third embodiment of the present invention.

FIGS. 41 and 42 illustrate the peripheral fan assembly 253 and the processor fan 255 assembly of the third embodiment of the present invention, respectively. The peripheral fan assembly 253 defines a plurality of card-receiving slots 257 on its upper face. In this particular embodiment, seven card receiving slots 257 are formed by the upper face.

FIG. 42 illustrates a perspective view of the processor fan assembly of the third embodiment of the present invention 255.

Figure 43:
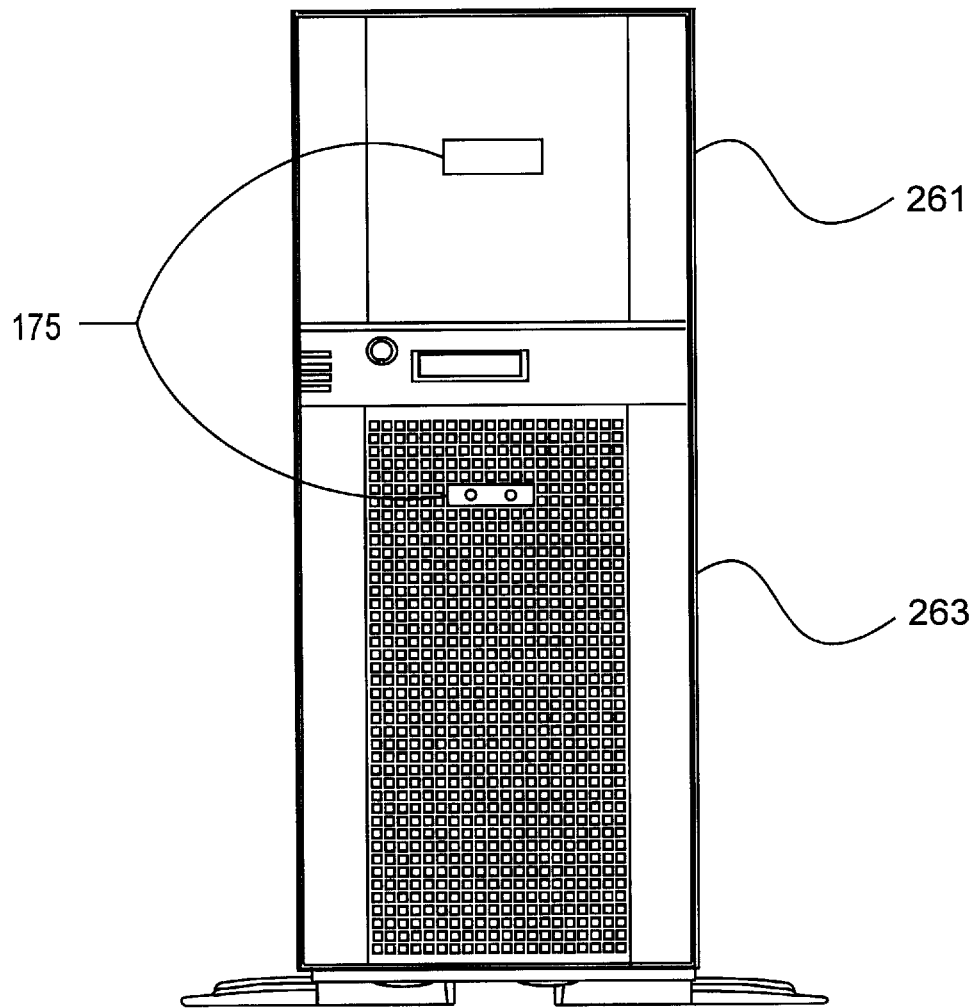
FIG. 43 illustrates a front elevational view of the chassis of FIG. 30 along the line 43–43'.

FIG. 43 illustrates a front perspective view of the third embodiment of the present invention along line 43–43' of FIG. 36. In this third embodiment, an upper plastics assembly 261 and a bottom plastics assembly 263 are provided. The upper plastics assembly 261 and lower plastics assembly 263 includes areas 175, where a manufacturer can place its name or computer model.

Figure 44:
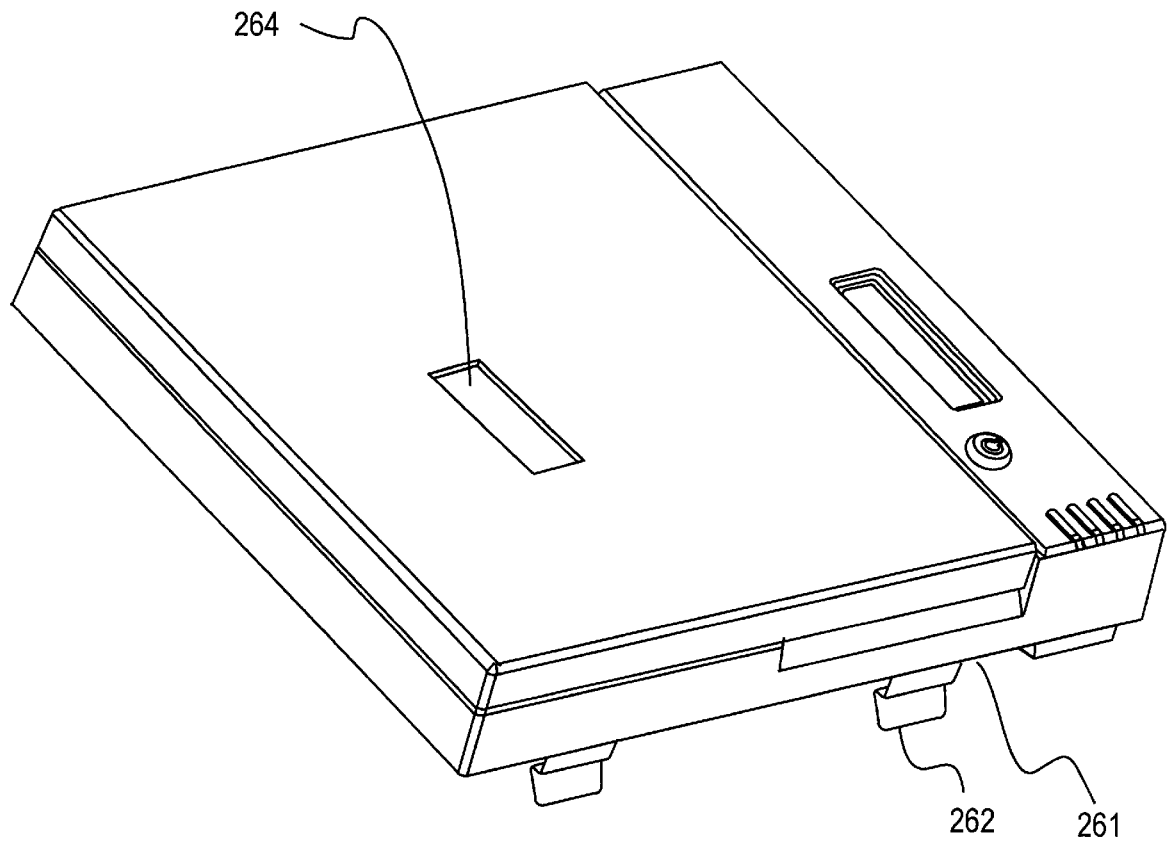
FIG. 44 illustrates a perspective view of an upper plastic assembly for use with the third embodiment of the present invention.

FIG. 44 illustrates an enlarged, perspective view of the top plastics assembly 261. The plastics assembly 261 includes two clips 262 for attachment to the chassis wrap 2 at locations previously noted. The plastics assembly 261 also includes an area 264 dedicated for use in identifying the manufacturer or type of computer.

Figure 45:
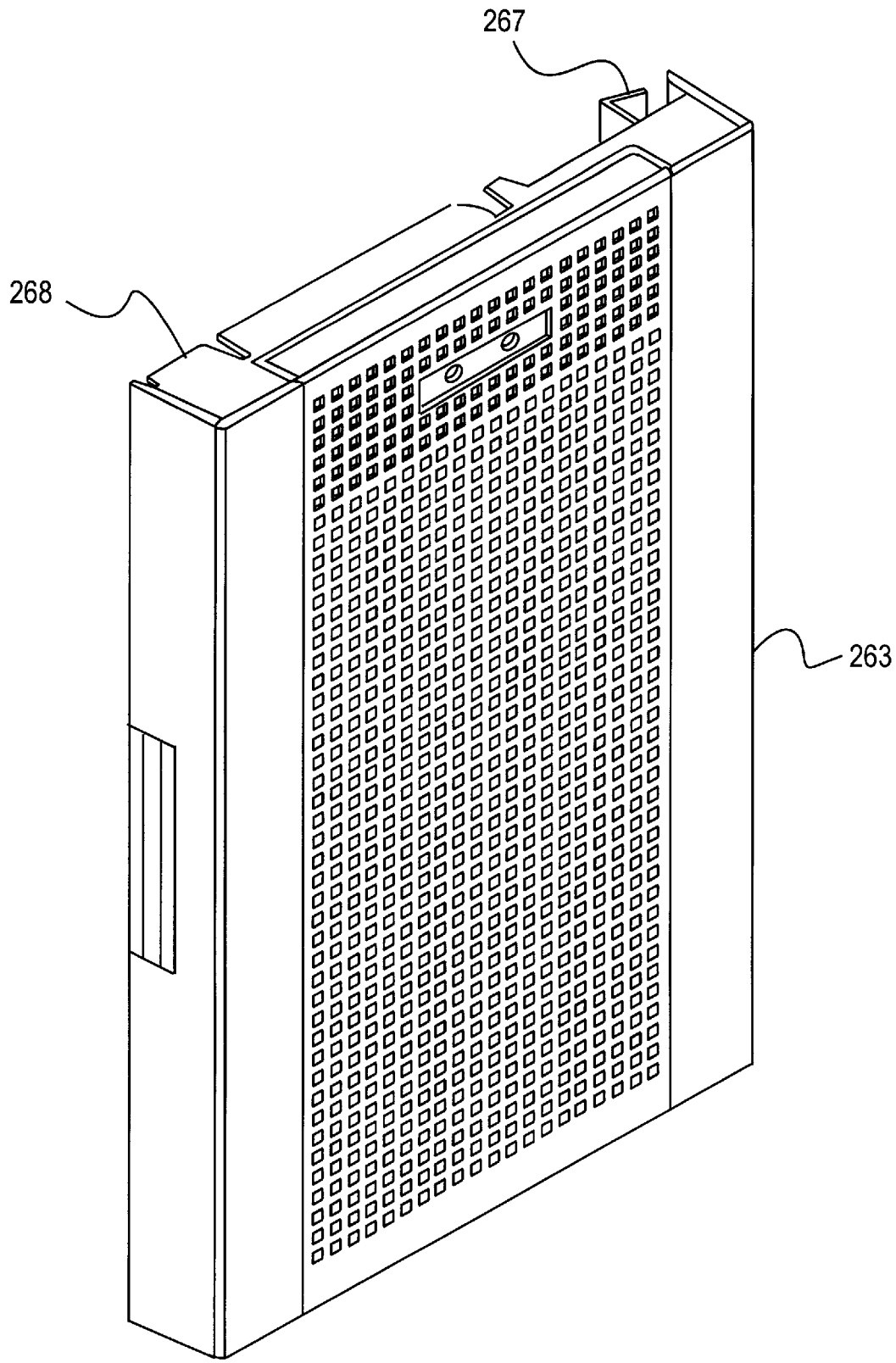
FIG. 45 illustrates a perspective view of a lower plastic assembly for use with the third embodiment of the present invention.

FIG. 45 illustrates an enlarged perspective view of the bottom plastics assembly 263. The bottom plastics assembly 263 defines a first extended portion 267 for attachment with the chassis wrap 2 at those locations previously described. Furthermore, it defines two other spring clips (not shown) for receiving the chassis wrap 2 at those locations previously described.

Figure 46:
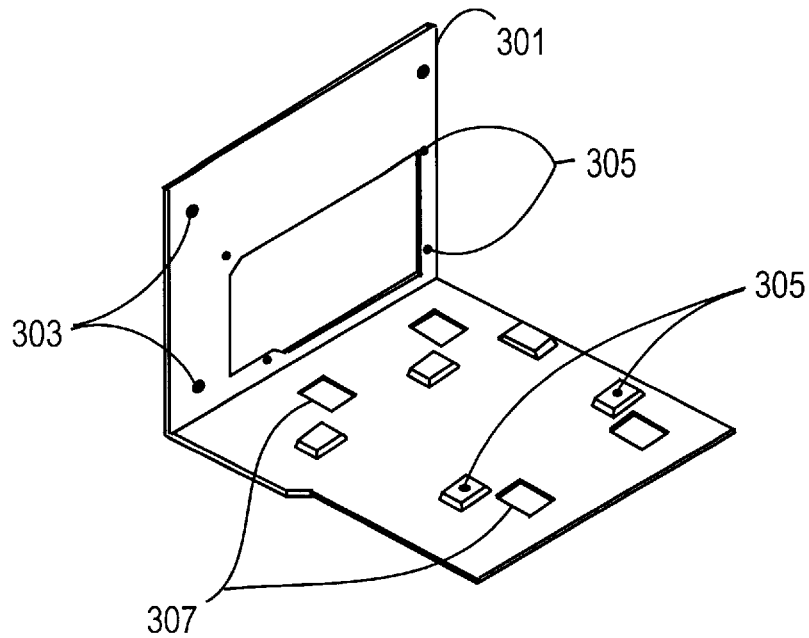
FIG. 46 illustrates a perspective view of a power supply adapter plate of the present invention.

FIG. 46 illustrates a perspective view of a power supply adapter plate 301 of the present invention. The power supply adapter plate 301 includes a plurality of mounting holes 303 for coupling the power supply adapter plate 301 to a vertical portion of the horizontal bulkhead 9. The power supply adapter plate 301 also includes a plurality of mounting holes 305 for coupling a power supply (e.g., element 111) to the power supply adapter plate 301. The power supply adapter plate 301 also includes a plurality of slots 307 for coupling and engaging the hooks 10, which are disposed on the horizontal bulkhead 9.

Figure 47:
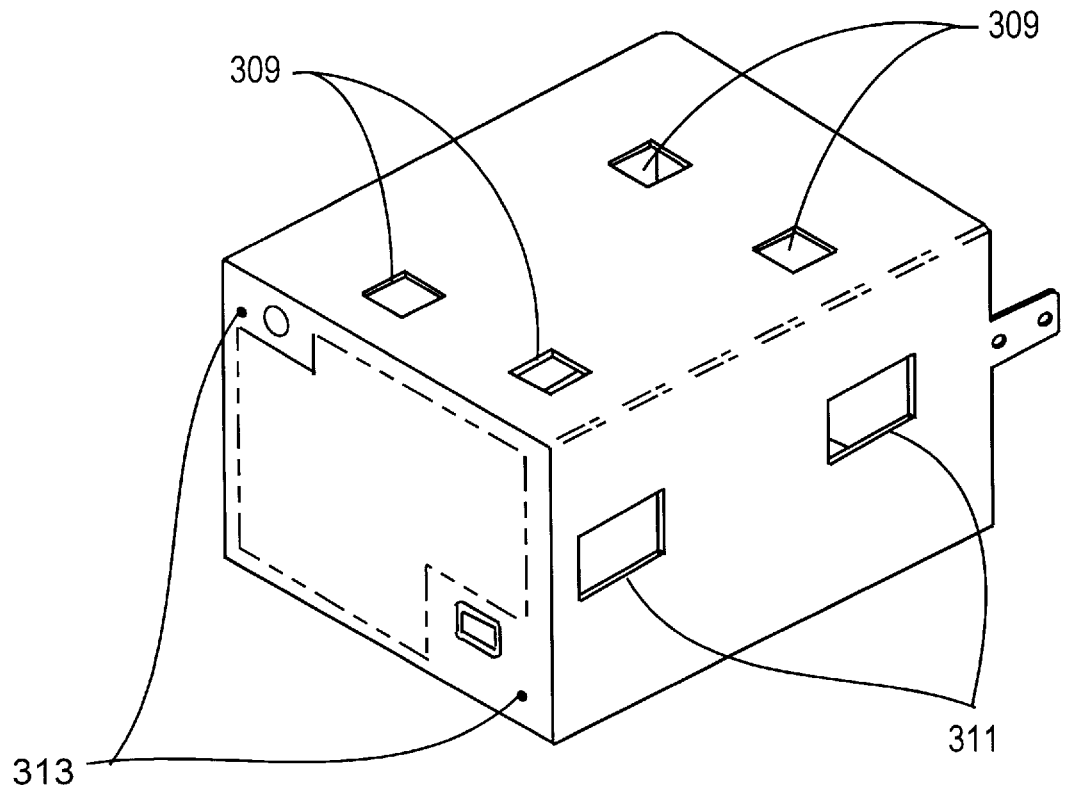
FIG. 47 illustrates a perspective view of the power supply of FIG. 16.

FIG. 47 illustrates a perspective view of the power supply 111 of FIG. 16. The power supply 111 includes a plurality of slots 309, disposed on a top surface, for receiving the hooks 10 that are disposed on the horizontal bulkhead 9. The power supply 111 also includes a plurality of slots 311, disposed on a sidewall, for engaging the hooks 10, which are disposed on the chassis wrap 2. The power supply 111 also includes a plurality of bolt holes 313 that are disposed on a rear wall, for coupling the power supply 111 to the vertical portion of the horizontal bulkhead 9.

While this invention has been described with reference to illustrative embodiments, this description is not intended to be construed in the limiting sense. Various modifications of these embodiments, such as the use of standard mechanical parts and structures, and other embodiments of the flexible computer chassis of the present invention, will be apparent to a person skilled in the art upon reference to this description. For example, the invention may be manufactured from a number of suitable materials and formed using any number of suitable machining processes.

We claim:

1. A computer chassis comprising:
   a chassis wrap having a baseboard mounting area, said baseboard mounting area having dimensions to alternately receive any one of a plurality of baseboards, each of said plurality of baseboards having particular unique dimensions; and
   any one of a plurality of baseboard mounting plates, wherein each of the baseboard mounting plates is to couple a particular one of the plurality of baseboards to the baseboard mounting area.

2. The computer chassis of claim 1 further comprising a vertical bulkhead, coupled to the chassis wrap, said vertical bulkhead including:
   a first set of mounting locations, wherein each of said first set of mounting locations is to mount a processor fan assembly corresponding to one or more of said plurality of baseboards; and
   a second set of mounting locations, wherein each of said second set of mounting locations is to mount a peripheral fan assembly corresponding to one or more of said plurality of baseboards.

3. The computer chassis of claim 2 further comprising a module rail, wherein said module rail is to couple to the vertical bulkhead, said vertical bulkhead further comprising a third set of mounting locations at which said module rail couples, said third set of mounting locations, in combination with said module rail, to support computer cards disposed on the baseboard, each of said computer cards having any one of a plurality of particular computer card heights.

4. The computer chassis of claim 3 wherein the plurality of particular computer card heights include approximately 4.85 inches, approximately 6.2 inches, and approximately 7.2 inches.

5. The computer chassis of claim 3 further comprising a module rail clip for coupling said module rail to any one of said third set of mounting locations.

6. The computer chassis of claim 1, wherein the chassis wrap further includes a front portion, said front portion including:
   a first set of mounting locations to receive any one of a plurality of top plastic assemblies, wherein each of said plurality of top plastic assemblies have unique particular dimensions; and
   a second set of mounting locations to receive any one of a plurality of bottom plastic assemblies, wherein each of said plurality of bottom plastic assemblies have unique particular dimensions.

7. The computer chassis of claim 1, further comprising a horizontal bulkhead, coupled to the chassis wrap, said horizontal bulkhead including:
   a plurality of mounting locations to receive any one of a plurality of power supplies, wherein each of the plurality of power supplies have unique particular dimensions.

8. The computer chassis of claim 7 further comprising any one of a plurality of unique power supply adapter plates, wherein each of the plurality of power supply adapter plates corresponds to at least one of said plurality of power supplies, said power supply adapter plates to couple the corresponding power supply to the horizontal bulkhead.

9. The computer chassis of claim 8, wherein:
   the horizontal bulkhead includes a vertical portion and a horizontal portion;
   each power supply adapter plate includes a vertical portion and a horizontal portion;
   each power supply adapter plate includes a plurality of mounting holes, disposed on the vertical portion of the power supply adapter plate, to couple with the vertical portion of the horizontal bulkhead; and
   each power supply adapter plate includes a plurality of slots, disposed on the horizontal portion of the power supply adapter plate, to couple with the horizontal portion of the horizontal bulkhead.

10. The computer chassis of claim 1 wherein the chassis wrap further includes a rear input/output (I/O) panel configured to receive any one of a plurality of patch panels, wherein each of said plurality of patch panels defines a particular unique plurality of connector openings corresponding to each of said plurality of baseboards.

11. The computer chassis of claim 10 further comprising a module rail, wherein said module rail is to couple to any one of said plurality of patch panels, wherein each of said plurality of patch panels includes a set of mounting locations at which said module rail couples, said set of mounting locations, in combination with said module rail, to support computer cards disposed on the baseboard, each of said computer cards having any one of a plurality of particular computer card heights.

12. The computer chassis of claim 11 wherein the plurality of particular computer card heights include approximately 4.85 inches, approximately 6.2 inches, and approximately 7.2 inches.

13. The computer chassis of claim 11 further comprising a module rail clip to couple said module rail to said set of mounting locations on any one of said plurality of patch panels.

* * * * *

UNITED STATES PATENT AND TRADEMARK OFFICE
CERTIFICATE OF CORRECTION

PATENT NO.     : 5,865,518    Page 1 of 1
DATED          : February 2, 1999
INVENTOR(S)    : Jarrett et al.

It is certified that error appears in the above-identified patent and that said Letters Patent is hereby corrected as shown below:

Column 7,
Line 52, delete "fan".

Signed and Sealed this

Sixteenth Day of December, 2003

JAMES E. ROGAN
*Director of the United States Patent and Trademark Office*